(12) United States Patent
Wammetsberger et al.

(10) Patent No.: US 10,613,138 B2
(45) Date of Patent: Apr. 7, 2020

(54) METHOD AND DEVICE FOR LOADING AND UNLOADING DEVICES UNDER TEST INTO A TESTER BY FLIPPING

(71) Applicant: RASCO GmbH, Kolbermoor (DE)

(72) Inventors: Christian Wammetsberger, Kolbermoor (DE); Andreas Wiesböck, Stephanskirchen (DE); Klaus Ilgenfritz, Flintsbach (DE); Dieter Schmid, Bruckmühl (DE); Max Schaule, Mindelheim (DE); Alex Waldauf, Söll (AT)

(73) Assignee: RASCO GMBH, Kolbermoor (DE)

( * ) Notice: Subject to any disclaimer, the term of this patent is extended or adjusted under 35 U.S.C. 154(b) by 87 days.

(21) Appl. No.: 15/776,322

(22) PCT Filed: Jan. 15, 2016

(86) PCT No.: PCT/IB2016/050187
§ 371 (c)(1),
(2) Date: May 15, 2018

(87) PCT Pub. No.: WO2017/122048
PCT Pub. Date: Jul. 20, 2017

(65) Prior Publication Data
US 2018/0348296 A1 Dec. 6, 2018

(51) Int. Cl.
*G01R 31/28* (2006.01)
(52) U.S. Cl.
CPC ..... *G01R 31/2893* (2013.01); *G01R 31/2868* (2013.01)
(58) Field of Classification Search
None
See application file for complete search history.

(56) References Cited

U.S. PATENT DOCUMENTS

| 4,926,118 A | 5/1990 | O'Connor et al. |
| 2011/0074458 A1 | 3/2011 | Di Stefano et al. |

(Continued)

FOREIGN PATENT DOCUMENTS

| EP | 2 214 467 A1 | 8/2010 |
| WO | WO-2015/070135 A2 | 5/2015 |

OTHER PUBLICATIONS

International Search Report dated Dec. 6, 2016 in PCT/IB2016/050187 (5 pgs.).

*Primary Examiner* — Jas A Sanghera
(74) *Attorney, Agent, or Firm* — Foley & Lardner LLP

(57) ABSTRACT

According to the present invention there is provided a method of handling devices comprising the steps of, receiving a tray on which devices to be tested are supported, into a flipping station; positioning the tray under a boat, so that the devices which are supported on the tray are sandwiched between the tray and a surface of the boat which can support devices, to form a first stack; flipping the first stack, so that the tray is positioned over the boat, to cause the devices to fall, under the influence of gravity, away from the tray to become supported on the surface of the boat, thereby transferring the devices from the tray to the surface of the boat; moving the boat to a testing station and testing the devices on the boat; receiving the boat of tested devices into the flipping station; positioning a tray over the boat, so that the devices which are supported on the surface of the boat are sandwiched between the surface of the boat and tray to form a second stack; flipping the second stack so that the boat is positioned over the tray, to cause the devices to fall, under the influence of gravity, away from the surface of the boat to become supported on the tray, thereby transferring the devices from the surface of the boat to the tray.

14 Claims, 28 Drawing Sheets

(56) References Cited

U.S. PATENT DOCUMENTS

2012/0146678 A1* 6/2012 Lanowitz ............ G01R 31/2893
324/756.02
2013/0125658 A1* 5/2013 Lee ......................... B07C 5/00
73/663

* cited by examiner

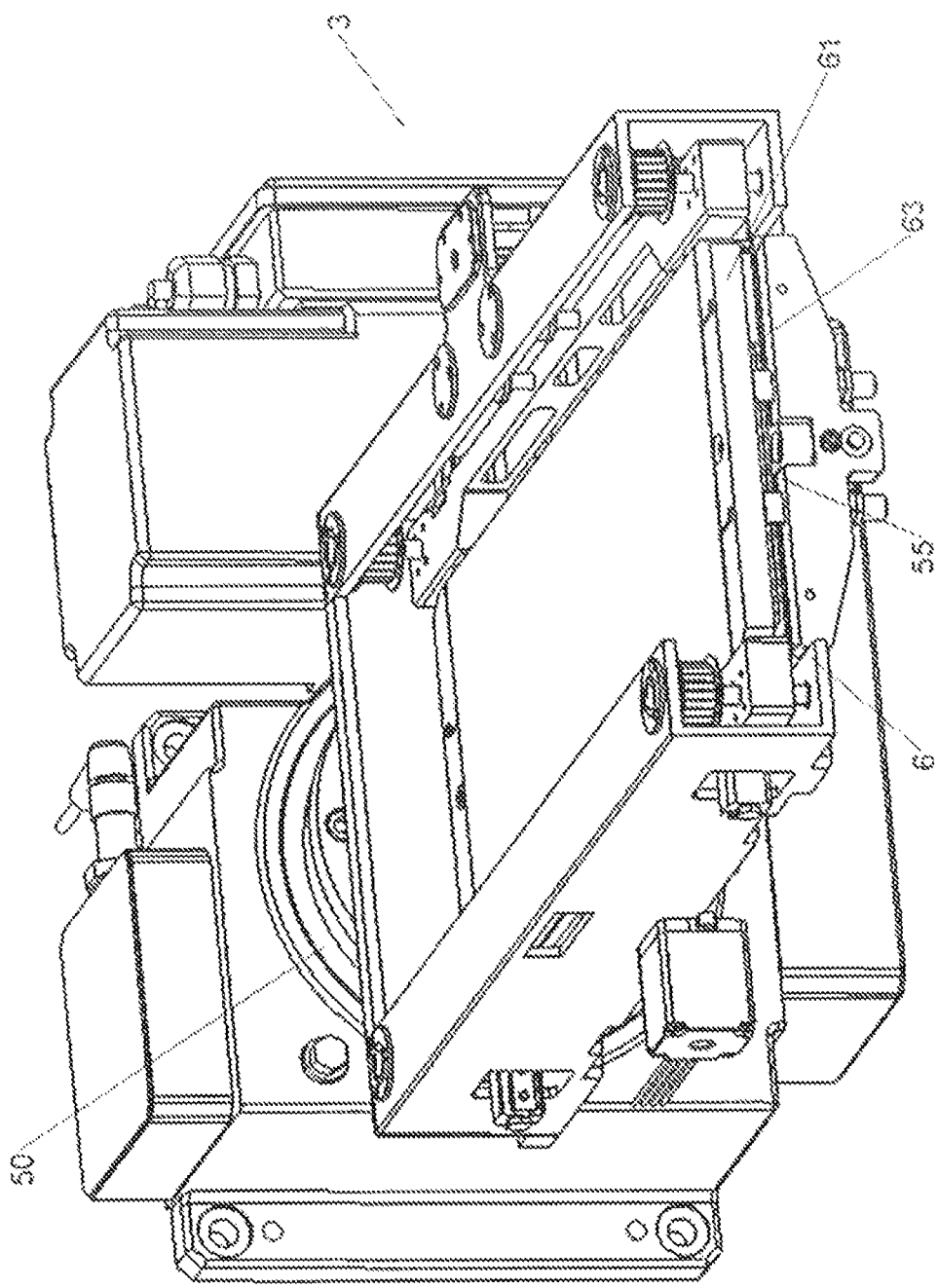

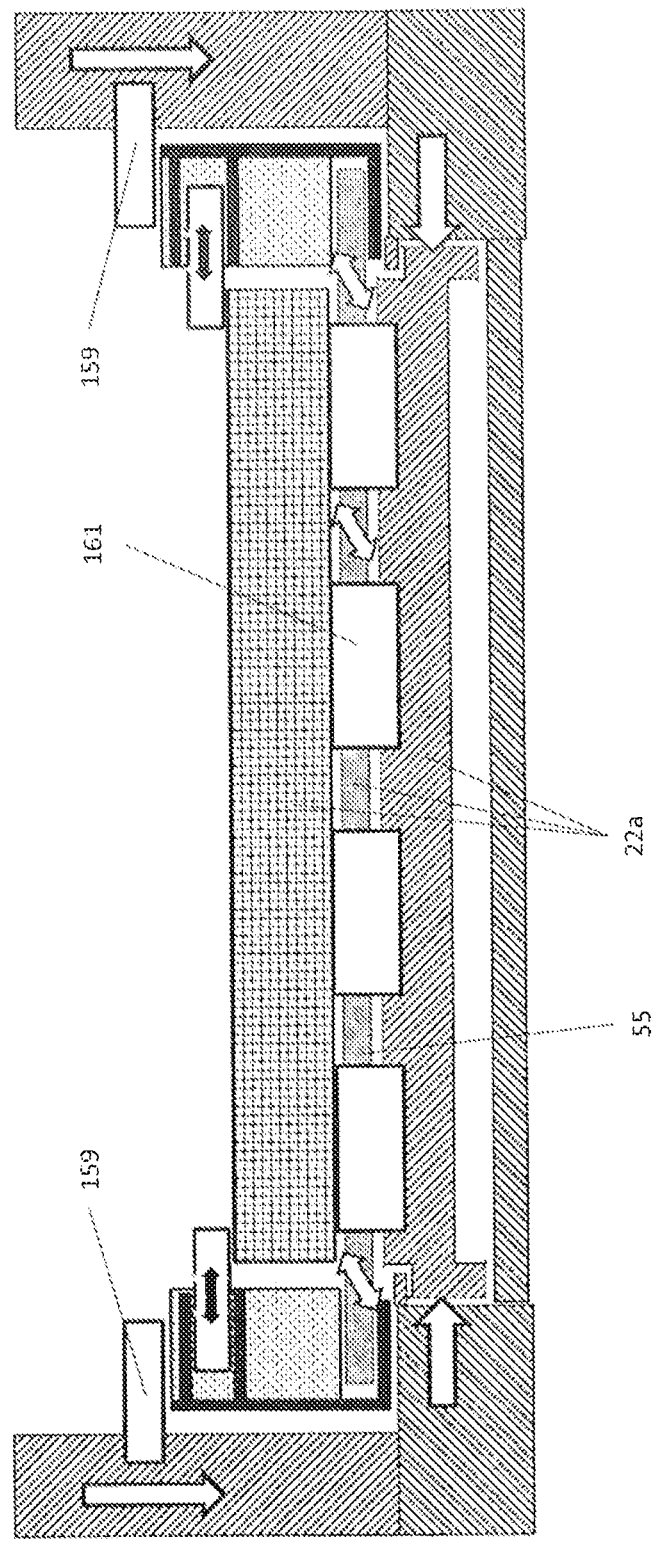

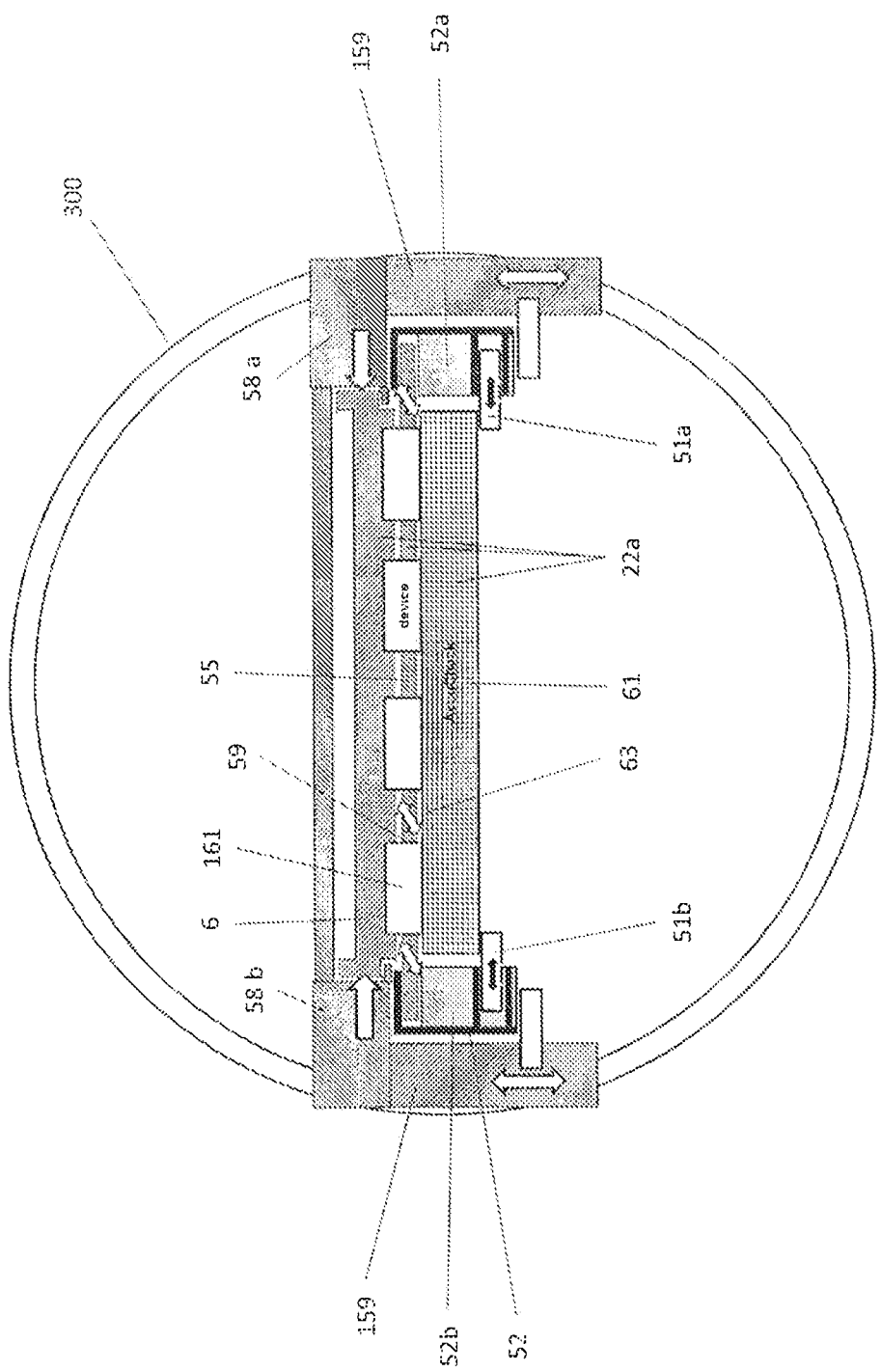

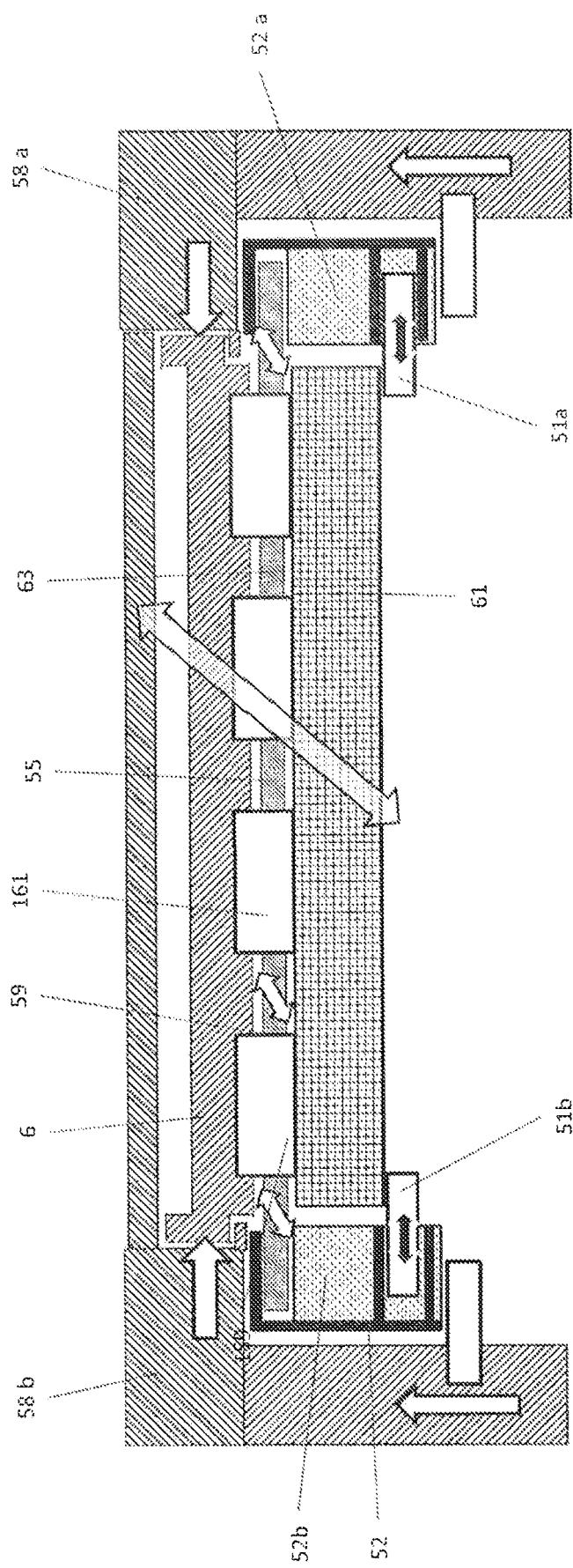

METHOD AND DEVICE FOR LOADING AND UNLOADING DEVICES UNDER TEST INTO A TESTER BY FLIPPING

CROSS REFERENCE TO RELATED APPLICATIONS

This application is a national stage entry of International Appl. No. PCT/IB2016/050187, filed Jan. 15, 2016, the contents of which are herein incorporated by reference in their entirety.

FIELD OF THE INVENTION

The present invention concerns a method of handling devices which involves flipping a first stack comprising a boat and tray to transfer devices from the tray to the boat and flipping a second stack comprising a boat and tray to transfer devices from the boat to the tray. There is further provided a corresponding assembly.

DESCRIPTION OF RELATED ART

Typically in handling assemblies devices are transported using boats. For example devices to be tested are loaded onto the surface of a boat, and then the boat is moved to the testing area where the devices are tested. In some cases the boat will be passed through processing stations where the devices are processed before testing, for example the boat may be passed through heaters that heat the devices to a predefined temperature required for testing. After the devices on the boats are tested those tested devices are unloaded from the boat.

In existing solutions the devices to be tested are loaded onto a boat using a pick-and-place head; and tested device are unloaded from a boat also using a pick-and-place head. Current techniques used to load devices to be tested onto a boat, and unload tested devices from a boat are inadequate; in particular the current techniques are too slow and show a lower reliability.

It is an aim of the present invention to obviate or mitigate the advantages associated with existing solutions.

BRIEF SUMMARY OF THE INVENTION

According to the invention, there is provided a method of handling devices comprising the steps of, receiving a tray on which devices to be tested are supported, into a flipping station; positioning the tray under a boat, so that the devices which are supported on the tray are sandwiched between the tray and a surface of the boat which can support devices, to form a first stack; flipping the first stack, so that the tray is positioned over the boat, to cause the devices to fall, under the influence of gravity, away from the tray to become supported on the surface of the boat, thereby transferring the devices from the tray to the surface of the boat; moving the boat to a testing station and testing the devices on the boat; receiving the boat of tested devices into the flipping station; positioning a tray over the boat, so that the devices which are supported on the surface of the boat are sandwiched between the surface of the boat and tray to form a second stack; flipping the second stack so that the boat is positioned over the tray, to cause the devices to fall, under the influence of gravity, away from the surface of the boat to become supported on the tray, thereby transferring the devices from the surface of the boat to the tray.

In one embodiment the step of positioning the tray under a boat further comprises moving the tray so that a surface of the boat abuts the devices that are supported on the tray so that the boat and tray simultaneously abut the devices when the first stack is formed. In the most favourable embodiment there is an gap between the boat and devices when the boat is positioned over the tray; in this embodiment the first stack includes an airgap between the surface of the boat and the devices that are supported on the tray—when the first stack is flipped the devices fall away from the tray, under the influence of gravity, across the airgap, to become supported on the surface of the boat.

In one embodiment the step of positioning a tray over the boat further comprises moving the tray so that the tray abuts the devices that are supported on the surface of the boat so that the tray and boat simultaneously abut the devices when the second stack is formed. In the most favourable embodiment there is an gap between the tray and devices when the tray is positioned over the boat; in this embodiment the second stack includes an airgap between the tray and the devices that are supported on the surface of the boat—when the second stack is flipped the devices fall away from the surface of the boat, under the influence of gravity, across the airgap, to become supported on the tray.

The method may comprise, interposing a grid, which comprises a plurality of cut-outs defined therein, between the surface of the boat and tray on which the devices are supported, so that the first stack further comprises the grid; arranging the grid so that, after the first stack has been flipped, the devices which are supported on the surface of the boat project into a respective cut out in the grid; after the first stack has been flipped, vibrating the first stack (or vibrating the grid at least) so that each of the devices abuts an edge defining a respective cut-out, so as to move the devices into predefined respective positions on the surface of the boat.

In one embodiment when the first stack is flipped, the devices fall, under the influence of gravity, away from the tray, and through respective cut-outs in the grid, to become supported on the surface of the boat, thereby transferring the devices from the tray to the surface of the boat. After the devices have become supported on the tray the devices will project into the cut-outs in the grid therefor vibration of the grid and/or, tray and/or boat will vibrate/move the devices.

The method may comprise applying a vacuum to hold the devices, which sucks the devices towards the boat, immediately after the step of vibrating is completed so that the devices are held in their respective predefined positions on the surface of the boat.

The method may comprise, interposing a grid, which comprises a plurality of cut-outs defined therein, between the tray and the surface of the boat on which the devices are supported, so that the second stack further comprises the grid; arranging the grid so that, after the first stack has been flipped, the devices which are supported on the tray project into a respective cut out in the grid; after the second stack has been flipped, vibrating the grid and the tray so that each of the devices abuts an edge defining a respective cut-out, so as to move the devices into predefined respective positions on the tray.

In a preferred embodiment the tray will comprise a plurality of pockets; each pocket configured to hold a device. The vibration of the grid and tray will urge the devices to move into their respective pocket on the tray. Thus the vibration of the grid and tray will ensure that devices a properly positioned within their respective pockets in the tray.

The method may comprise scanning the devices which are supported on the surface of the boat using a camera; detecting using image information provided by the camera if any of the devices on the surface of the boat are displaced from a respective predefined position; picking any devices which are identified as being displaced from their respective predefined position using a pickup head; placing the picked devices on the boat in a position corresponding to said device's respective predefined position.

The method may comprise using a pickup head to adjust the positions of one or more devices on the boat so that the devices form a predefined pattern on the surface of the boat.

The method may comprise, moving the boat into a soak station; and heating the devices on the boat to a predefined temperature at the soak station; and then moving the boat from the soak station to a test station where the devices on the boat are tested.

The method may comprise, after flipping the second stack to transfer the devices from the surface of the boat to the tray, picking only those devices from the tray which failed testing at the test station, and replacing the picked devices with devices which have passed testing at the test station.

The method may comprise, after flipping the second stack to transfer the devices from the surface of the boat to the tray,
(i) picking a device from the tray which failed testing at the test station to provide a vacant pocket in the tray,
(ii) picking a replacement device from a source-tray, wherein the source tray has supported thereon only devices which have passed testing at the test station, and positioning the replacement device into the vacant pocket of the tray;
(iii) repeating said steps (i) and (ii) until all the devices which failed testing at the test station have been replaced with a respective replacement device from the source-tray.

The method may comprise the step of, when all the replacement devices have been picked from the source-tray so that the source-tray is empty, replacing the empty source-tray with the last tray to have undergone flipping.

Preferably the method comprises the steps of, when all the devices have been picked from the source-tray so that the source-tray is empty, replacing the empty source-tray with the last tray to have undergone flipping and which all of the devices supported thereon had passed testing at the test station, or which all of the devices supported thereon which failed testing have been replaced with a replacement device from a source-tray.

The method may comprise, disposing of the picked devices which failed testing at the test station in a tray designated to hold devices which failed testing.

The method may comprise, scanning the devices on the tray as the tray is being received into the flipping station using a camera, so that the step of scanning is performed simultaneously to said step of receiving a tray on which devices to be tested are supported, into a flipping station; using image data provided by the camera as the tray is being received into the flipping station, to determine one or more of, the number of devices on the tray, the type of devices on the tray, if any of the devices on the tray are displaced from a predefined position, a code provided on each device; and after the step of flipping the second stack has been performed, then, exporting the tray from the flipping station, and scanning the devices on the tray as the tray is being exported from the flipping station using the camera, so that the step of scanning is performed simultaneously to said step of exporting the tray; using image data provided by the camera as the tray is being exported from the flipping station, to determine one or more of, the number of devices on the tray, the type of devices on the tray, if any of the devices on the tray are displaced from a predefined position, a code provided on each device.

The camera may be a linear scan camera for example. It can be determined from the image data if any devices are missing from the tray, or if there a device is displaced (e.g. two devices overlapping so that they occupy the same position), or it can be determined if all the devices are a predefined type of devices by reading a device code on each device using the camera. This check can be done initially at the tray is first being passed into the flipping station and also as the tray is leaving the flipping area.

The method may comprise
(a) providing a first and second soak stations each of which is configured to receive one or more boats on which devices to be tested are supported; and wherein the first and second soak stations each comprise temperature adjustment means which can heat and/or cool boats and devices which are located in that respective temperature station;
(b) populating both the first and second soak stations with one or more boats on which devices to be tested are supported, until the first and second temperature stations are fully populated with boat on which devices to be tested are supported;
(c) removing a boat from the first soak station to leave a vacant position in the first soak station, and, moving the removed boat to the test station; and refilling the vacant position in the first soak station with a replacement boat on which devices to be tested are supported, as the removed boat is being tested at the test station;
(d) repeat step (c) until all of the boats that were initially provided in the first soak station at step (b) have been moved to the test station and their respective vacant positions in the first soak station have been refilled with respective replacement boats having devices to be tested;
(e) after step (d) is completed then, removing a boat from the second soak station to leave a vacant position in the second soak station, and, moving the removed boat to the test station; and refilling the vacant position in the second soak station with a replacement boat on which devices to be tested are supported, as the removed boat is being tested at the test station;
(d) repeat step (e) until all of the boats that were initially provided in the second soak station at step (b) have been moved to the test station and their respective vacant positions in the second soak station have been refilled with respective replacement boats having devices to be tested.

The temperature adjustment means comprises a heating and/or a cooling means.

Preferably the step (c) of removing a boat from the first soak station comprises removing a boat from the first soak station after devices in the boat have reached a predefined temperature.

The method may comprise repeating steps (c)-(d) a plurality of times.

The method may comprise the steps of, moving a boat on which there is supported devices which have been tested, from the test station, over the second soak station, to the flipping station, simultaneously to performing said step of moving a removed boat, which was removed from the first soak station, to the test station; and moving a boat on which there is supported devices which have been tested, from the test station, over the first soak station, to the flipping station, simultaneously to performing the step of moving a removed boat which was removed from the second soak station to the test station.

Preferably the first and second soak stations are equal distance from the test station, and are positioned symmetrically with respect to the test station, and are positioned between the test station and flipping station.

There is further provided an assembly for handling devices, the assembly comprising one or more trays, one or more boats, a flipping station, a testing station, and a data processing means programmed for implementing any one or more of the above-mentioned method steps.

BRIEF DESCRIPTION OF THE DRAWINGS

The invention will be better understood with the aid of the description of an embodiment given by way of example and illustrated by the figures, in which:

FIG. 2a is perspective view of the flipping station in the assembly of FIGS. 1a and 1b.

FIG. 5b shows a plan view of the assembly of FIG. 5a;

FIG. 10a-g illustrate the steps which are performed at the flipping station in order to transfer devices, which are due to be tested, from a tray to a surface of an empty boat;

FIG. 11b is a cross-sectional perspective view of the grid of FIG. 11a.

DETAILED DESCRIPTION OF POSSIBLE EMBODIMENTS OF THE INVENTION

Figure 1A:
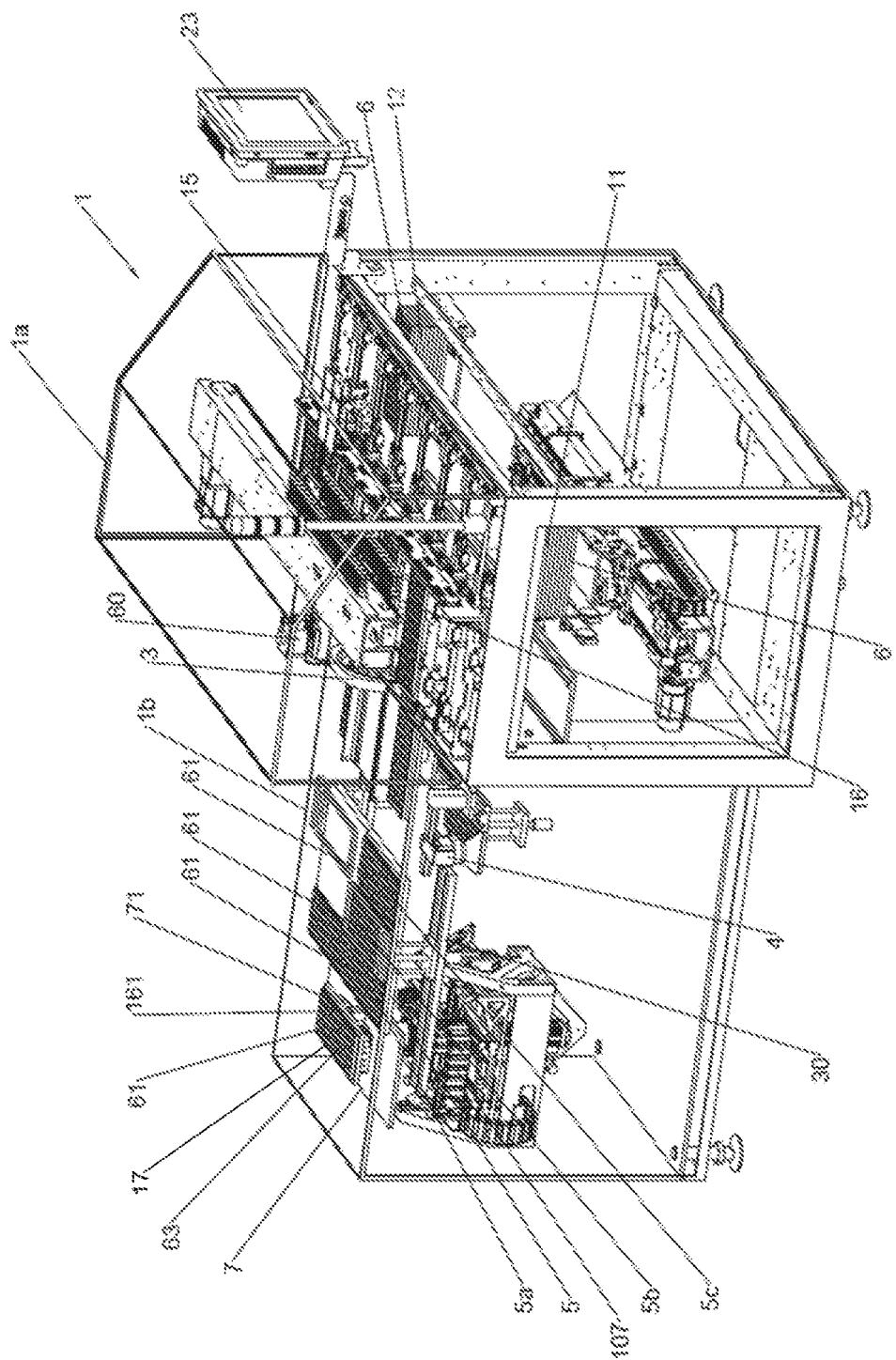
FIG. 1a shows a perspective view of an assembly according to the present invention.
Figure 1B:
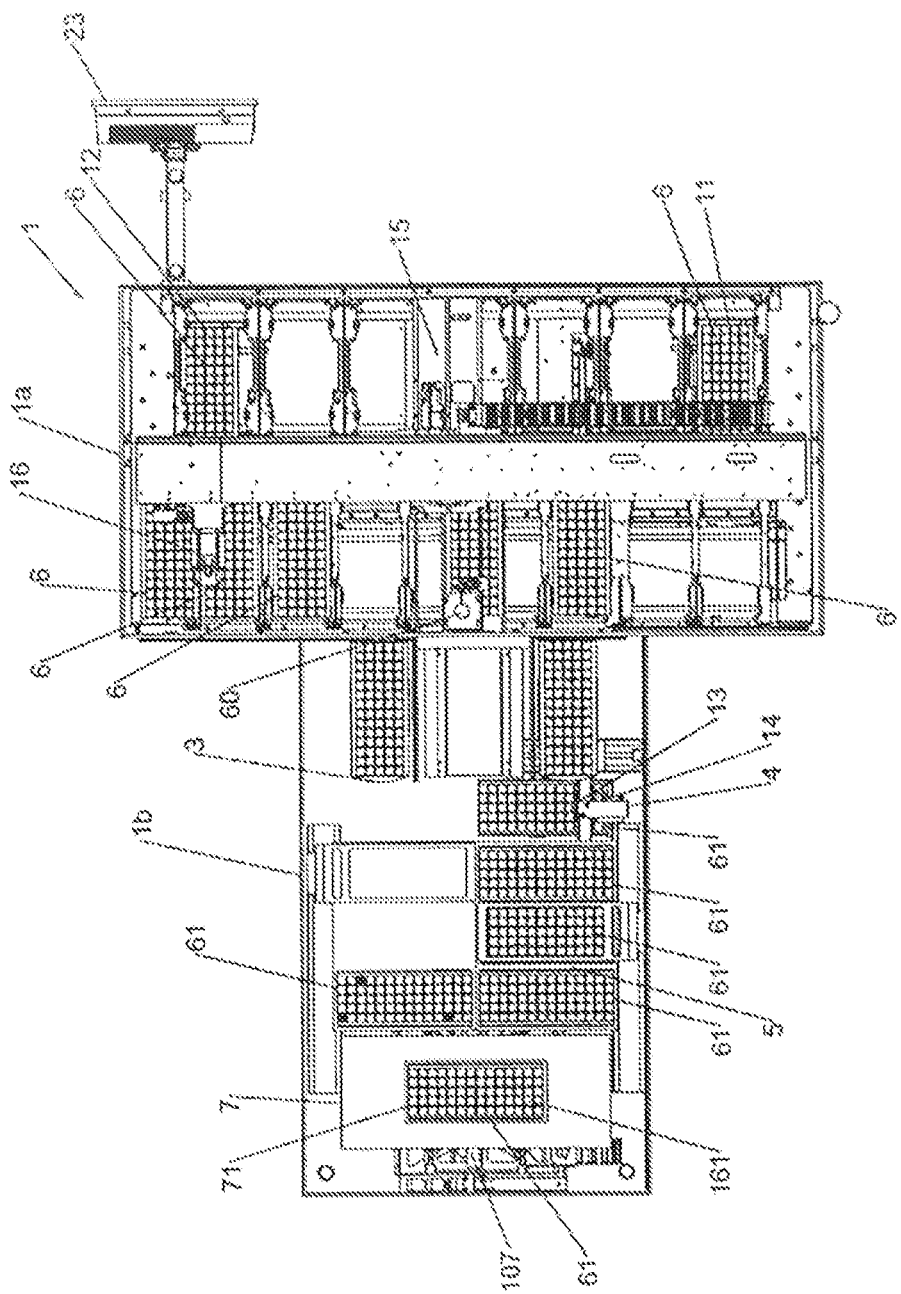
FIG. 1b shows a plan view of the assembly of FIG. 1b.

FIG. 1a provides a perspective view of a component handling assembly 1 according 1 to an embodiment of the present invention; and FIG. 1b provides a plan view of the component handling assembly 1. The component handling assembly 1 comprises an input-output module 1a and a test module 1b; the input-output module 1a is designed to supply trays 6, on which devices to be tested are supported, to the test module 1b and to receive trays on which devices which have been tested are supported, from the test module 1b.

The input-output module 1a of the component handling assembly 1 comprises: an input stack 11 of trays 6 each of which have supported thereon, devices which are to be tested; and an output-stack 12 of trays 6 each of which have supported thereon devices which have already been tested in the test module 1b; and a sorting station 16 at which devices which failed testing in the test module 1b are removed from the tray and replaced with devices which have passed testing.

The test module 1b of the assembly 1 comprises a flipping station 3 which can be used to transfer devices from a tray 6, which has been input to the test module 1b from the input-output module 1a, to a boat 61, as will be described in more detail later.

A shuttle 15 is provided in the assembly 1, which is operable to transport trays from the input stack 11 of the input-output module 1a to the flipping station 3 where the devices on the tray 6 can be transferred to a boat 61. The shuttle 15 can also transport trays 6 on which devices which have been tested are supported, from the flipping station 3 of the test module 1b to the output stack 12.

A scanning camera 60 is located in the assembly 1 such that it can capture images of devices on a tray 6 as the tray 6 is being moved by the shuttle 15 into the flipping station 3. In this embodiment the scanning camera 60 is located at an entrance of the flipping station 3.

The test module 1b of the assembly 1 further includes an inspection/alignment station 4, at which visual inspection of devices on a boat 61 (those devices having been transferred to the boat 61 at the flipping station 3) takes place. The inspection/alignment station 4 includes a camera 14, which can scan the devices which are supported on the surface 63 of a boat 61; image data provided by the camera 14 is processed at a vision computer 23 (e.g. by the processor of the vision computer 23) of the assembly 1 to determine if any of the devices which are supported on the surface 63 of the boat 61 are displaced from a respective predefined position. The inspection/alignment station 4 further comprises a pickup head 13 which can be used to correct the positioning of any displaced device on the boat 61: the pickup head can pick any device which have been identified as being displaced from their respective predefined position, and to replace the device onto the surface 63 of the boat 61 in a position corresponding to the predefined position which that device should have.

In another embodiment the pickup head 13 can be used to reposition some or all of the devices on the surface 63 of the boat 61 so that the devices are arranged in a predefined pattern (e.g. in a pattern selected by the user).

There is also provided a single soak station 5 in the test module 1b of the assembly 1. The soak station 5 comprises three zones 5a-c each of which can receive a respective boat 61; thus in this example the soak station 5 can facilitate three boats 61 simultaneously. However it will be understood that the soak station 5 could be configured to facilitate any number of boats. The soak station 5 comprises heating means which is operable to heat, to a predefined temperature, devices 161 which are supported on three boats 61 which are located in the respective three zones 5a-c of the soak station 5. The soak station 5 may also comprise cooling means which is operable to cool, to a predefined temperature, devices 161 which are supported on three boats 61 which are located in the respective three zones 5a-c of the soak station 5. In different embodiment a first and second soak station is provided each of which comprise one or more zones which can receive a respective boat. Each of the first and second soak stations comprises heating means which is operable to heat, to a predefined temperature, the devices which are supported boats which are located in the respective zones of the respective soak stations.

The assembly 1 comprises a testing station 7 where devices 161 that are supported on a boat 61 can be tested. It will be understood that the testing station 7 may be configured to perform any type of testing e.g. optical testing, electrical testing etc.). In this example the testing station 7 comprises a plunger 17; the plunger 17 has a plunger head 71 on which a boat 61 having devices 161 to be tested can be supported; the plunger 17 may be operated to move a boat 61 which is located on the plunger head 71, into an x, y, z, Theta plunger unit 107 where testing of the devices 161 on the boat 61 is performed. The devices 161 can be tested at the x, y, z, Theta plunger unit 107 in any sequential pattern, because the plunger head 71 can move in 2 dimensions (e.g. can more in an x & y direction) and can rotate (e.g. can move in a Theta direction) to present the devices in any predefined order/pattern to the x, y, z, Theta plunger unit 107 for testing.

Boats 61 on which devices 161 are supported, can be moved between the different stations within the assembly 1 (i.e. between the flipping station 3, inspection/alignment station 4, soak station 5 and testing station 7) by moving along gantries 30 that interconnect the different stations; for example the boats 61 in the assembly 1 can be moved between different stations via overhead x,z gantries. In particular the boats 61 can move from the flipping station 3 where they receive devices 61 to be tested from a tray 6 which has come from the input stack 11; and then move via the gantry 30 to inspection/alignment station 4 where inspection of the devices 161 on the boats 61 takes place; the boats 61 can move via the gantry 30 from the inspection/alignment station 4 to the soak station 5 where the devices 161 are brought to a temperature required for testing; and then move via the gantry 30 to the testing station 7 where the moves the boat 61 into the testing unit 107 where the devices 161 are tested; and then move via the gantry 30 from the testing station 7 back to the flipping station 3 where the tested devices 161 are transferred back onto a tray 6.

FIG. 2a provides a perspective view of a flipping station 3. As can be seen from the figure the flipping station 3 comprises a flip member 50. A boat 61 which can carrier devices on its surface 63, and a tray 6, along with a grid 55 are shown to be held in the flip member.

Figure 2B:
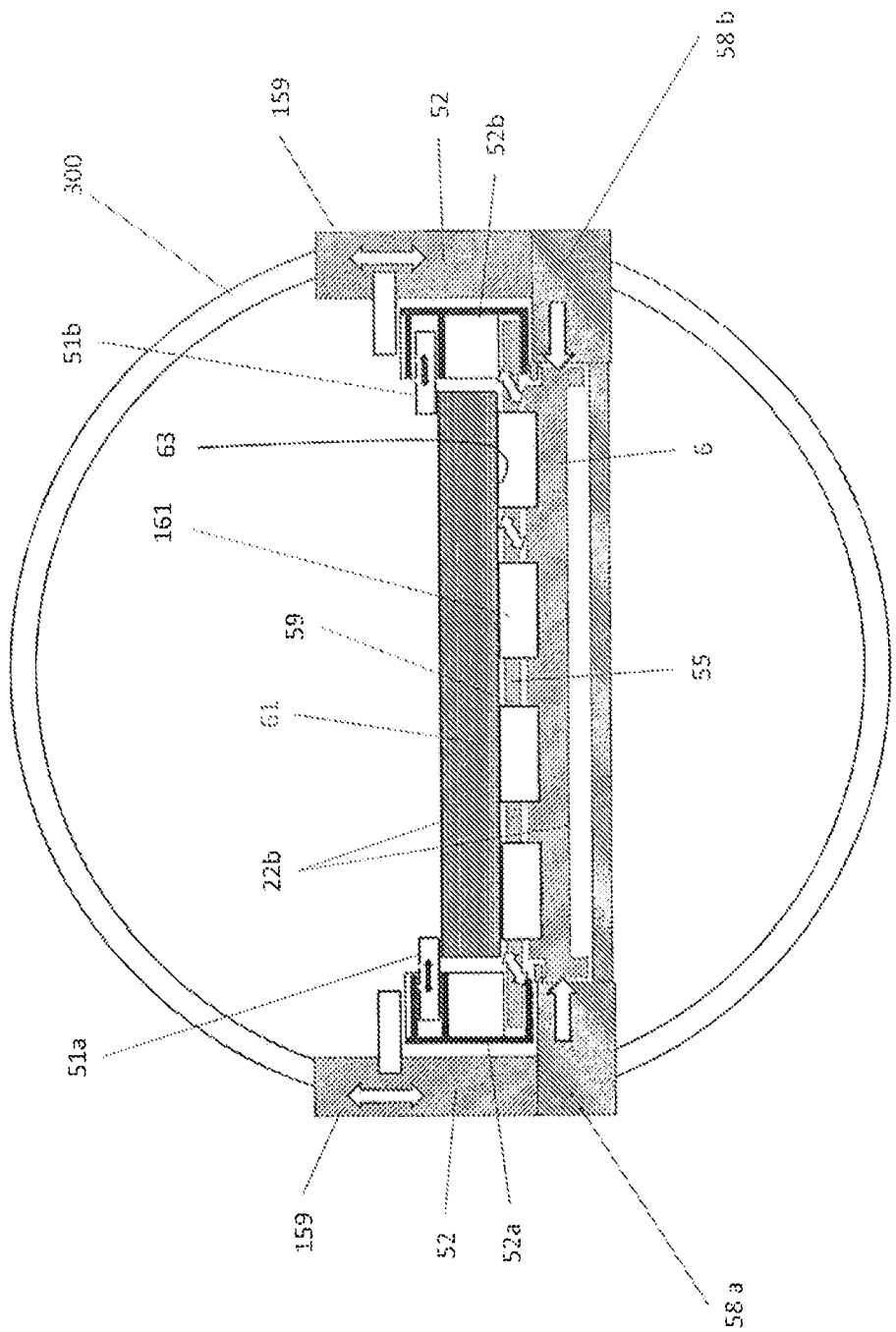
FIG. 2b is a frontal view of the flip member of the flipping station.

FIG. 2b frontal view of the flip member 50. The flip member comprises a clamp 58 comprising opposing jaw members 58a,b; the clamp 58 is operable to clamp a tray 6 between the opposing jaw member 58a,b. The flip member further comprises a holder 52 which is configured to simultaneously hold a grid 55 and a boat 61. The holder 52 comprises a first holder member 52a and a second, opposite, holder member 52b, which hold a grid 55 at opposite sides. The grid 55 is interposed between the tray 6 and surface 63 of the boat 61 on which devices 161 can be supported. The grid 55 comprises a plurality of cut-outs 59 each of which is large enough to allow a device 161 to pass through; it should be understood that the grid 55 is not essential to the present invention. The grid 55 can be selectively removed and/or replaced with another grid 55 having difference sized cut-outs 59. The first holder member 52a and a second, opposite, holder member 52b are further configured to allow the grid 55 to move within a predefined range of movement so that the grid 55 can be moved, after flipping, to move devices 161 supported on the surface 63 of the boat 61 into a predefined position (as will be described in more detail later). Each of the first holder member 52a and second, opposite, holder member 52b comprise a pin 51a,51b which can be selectively extended or retracted from the respective holder member 52a,52b; the distance between each of the pins 51a,51b and the grid 55 held by the first and second holder members 52a,b is substantially equal to the thickness of a boat 61. During use the pins 51a,51b are retraced into their respective holder members 52a,b so allow a boat 61 to be moved, between the first holder member 52a and a second, opposite, holder member 52b, to abut the grid 55; the pins 51a,51b are then extended from their respective holder members 52a,b so that the boat 61 is clamped between the pins 51a,51b and the grid 55. The holder 52 is attached to a pneumatic or servo driven lift 159 which is operable to selectively move the holder 52) and a grid 55 and boat 61 which may be held by the holder 52) in a first direction towards the clamp 58 or in a second, opposite, direction away from the clamp 58. In this embodiment the clamp 58 also attached to a fixed part of the pneumatic or servo driven lift 159; and the pneumatic lift is in turn attached cooperates with a substantially circular track 300; the pneumatic lift can more along substantially circular track 300 to effect flipping of a stack, comprising the boat 61, grid 55 and tray 6, by 180° so that devices 161 fall, under the influence of gravity, from the tray 6 onto the surface 63 of the boat 61 to transfer the devices 161 from the tray 6 to the surface 63 of the boat 61, and/or so that devices 161 fall, under the influence of gravity, from the surface 63 of the boat 61 to the tray 6 to transfer the devices from the surface 63 of the boat 61 to the tray 6; the devices 161 will pass through respective cut-outs 59 in the grid 55 as they fall.

Figure 2C:
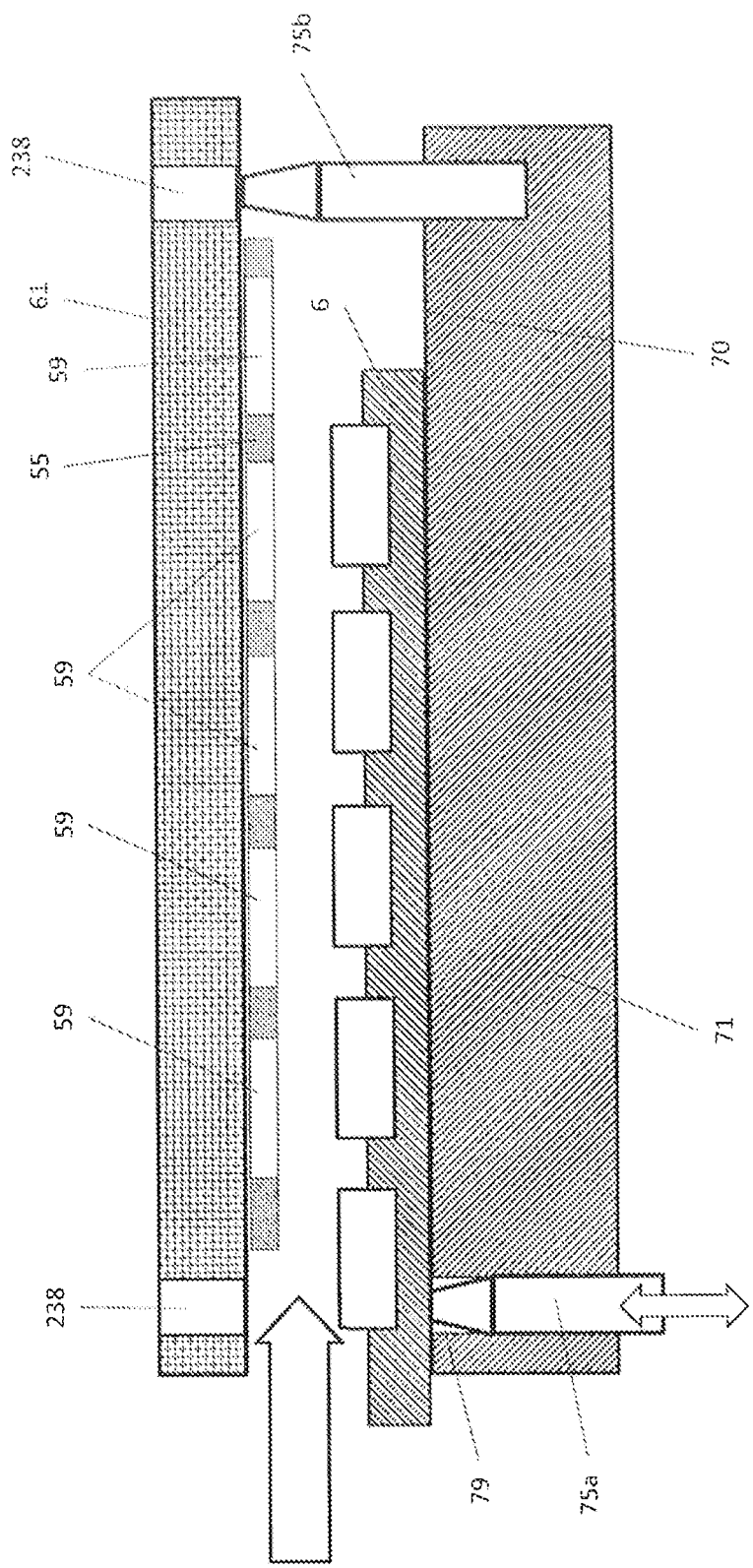
FIG. 2c shows a cross-sectional view of a portion of the flip member of the flipping station.

FIG. 2c shows a cross-sectional view of a portion of the flip member 50; as shown in FIG. 2c the flip member 50 further comprises alignment pins 75a,75b to facilitate positioning of a boat 61 into a predefined position in the flip member 50. During use a boat 61 which is received into the flip member 50 is positioned so that the alignment pins 75a,b are received into respective apertures 238 defined in the boat 61. Once the boat 61 is positioned so that the alignment pins 75a,b are received into respective apertures 238 defined in the boat 61 the boat 61 will be in a predefined position in the flip member 50. As shown in FIG. 2c, the alignment pins 75a,75b are arranged to extend from a surface 70 of a platform 71 of the flip member 50, on which the tray 6 is supported; at least one of the pins 75a can be selectively retracted and extended from a hole 79 defined in the platform 71. During use, are least one of the alignment pins 75a is retracted into the hole 79 to allow a tray 6 to be moved into the flip member 50 (e.g. slid horizontally along the surface 70 of the platform 71 of the flip member 50); the other alignment pin 75b restricts the movement of the tray 6—thus the tray 6 is slid horizontally along the surface 70 of the platform 71 of the flip member 50 until it abuts the other alignment pin 75b; once the tray 6 abuts other alignment pin 75b, the retracted alignment pin 75a is then extended from the hole 79 so that the tray 6 is held between the two alignment pins 75a,b. Subsequently, a boat 61 which is received into the flip member 50 is positioned so that the alignment pins 75a,b are received into respective apertures 238 defined in the boat 61.

In the embodiment of the assembly 1 shown in FIGS. 1a,b the scanning camera 60 is located between the flip member 50 and the input-output module 1b so that it is at an entrance of the flipping station 3.

Figure 3:
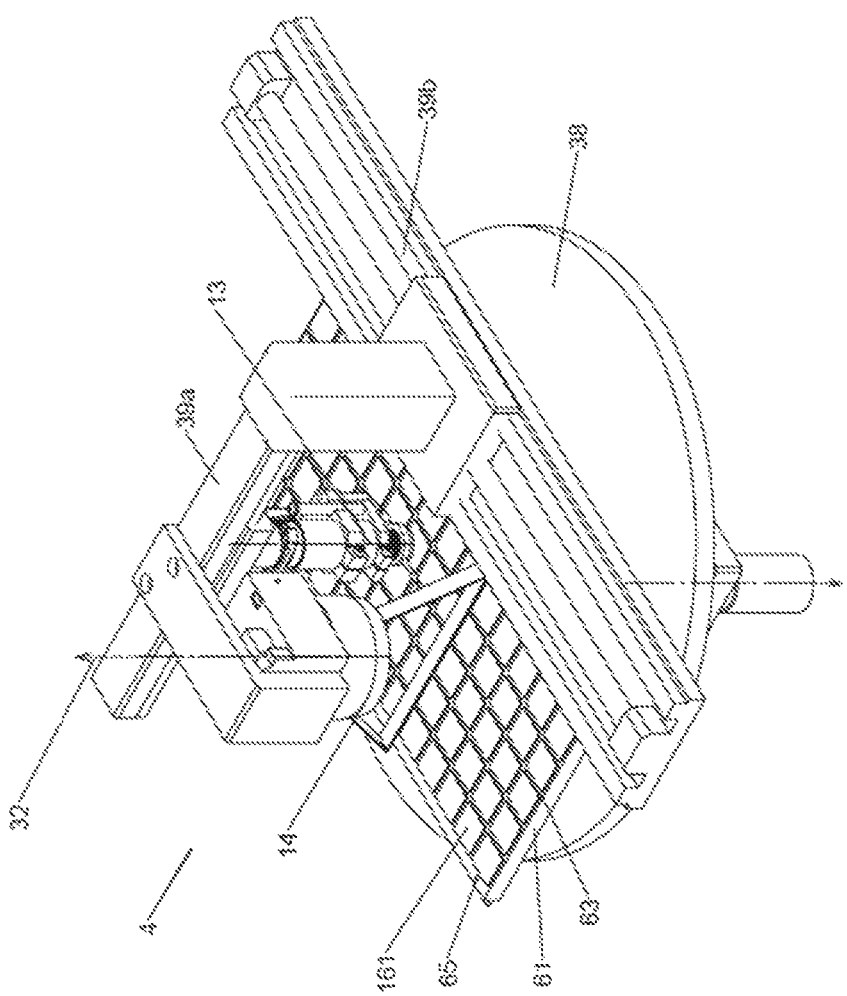
FIG. 3 is a perspective view of the inspection/alignment station in the assembly of FIGS. 1a and 1b.

FIG. 3 provides a perspective view of the inspection/alignment station 4 which is provided in the assembly 1. As mentioned the inspection/alignment station 4 includes a camera 14 and pickup head 13. FIG. 3 shows a boat 61 located at the inspection/alignment station 4 and the camera 14 is scanning devices 161 which are supported on the surface 63 of the boat 61. The surface 63 of the boat 61 comprises fiducials 65 which define predefined positions for each of the devices 161. The inspection/alignment station 4 comprises orthogonal support arms 39a,39b on which the camera 14 and pick up head 13 are mounted. The camera 14 and pick up head 13 can move along orthogonal support arms 39a,39b so that the camera 14 and pick up head 13 can be moved to be centred above any of the devices 161 on the boat 61. The inspection/alignment station 4 further comprises a rotatory table 38 on which the boat 61 is supported; the rotary table 38 can rotate about an axis 32 which is perpendicular to both support arms 39a,39b.

The camera 14 can move along orthogonal support arms 39a,39b to scan the devices 35 which are supported on the surface 63 of the boat 61 which is supported on the rotatory table 38, and sends image data to the vision computer 23 of the assembly 1; the vision computer 23 determines, using the image data, if any of the devices 161 which are supported on the surface 63 of the boat 61 are displaced from a respective predefined position. If a device 161 is identified as being displaced from their respective predefined position, the pickup head 13 can be used to correct the positioning of any displaced device 161: the pickup head 13 can pick any devices 161 which have been identified as being displaced from their respective predefined positions, and can replace those devices 161 onto the surface 63 of the boat 61 in a position corresponding to the predefined position which that device 161 should have. Specifically, the vision computer 23 receives consecutively, from the camera 14, images of each device 161 on the surface 63 of the boat 61; each image will also show fiducials 65 which define the predefined position which that device 161 should have; the vision computer 23 processes the image to determine from the image the offset between the boat 61 and the fiducials 22; if the offset is below a predefined threshold then the device 161 will be deemed to be in the correct position on the surface 63 of the boat 61; if however the image shows that the offset of the device 161 with respect to the fiducials 22 is greater than the predefined threshold then the device 161 will be deemed to be displaced from its predefined position and pick up head 13 will be moved, along the support arms 39a,39b, to be positioned above the displaced device 161, and will pick that device 161; the pick-up head 13 will then place the device again in an orientation in which the device is aligned with the fiducials 22 so that the device 161 occupies a position on the surface 63 of the boat 61 which corresponds to its predefined position. These steps are carried out for each device 161 on the surface 63 of the boat 61 to ensure that all devices 161 are in a position corresponding to their respective predefined positions on the surface 63 of the boat 61.

In another embodiment the pick-up head 13 is not used exclusively to correct the positions of displaced devices 161. In another embodiment the pickup head 13 picks all or some of the devices 161 on the surface 63 of the boat 61, and places the picked devices 161 at predefined positions to form a predefined pattern of devices 161 on the surface 63 of the boat 61 (e.g. in a pattern selected by the user).

Figure 4:
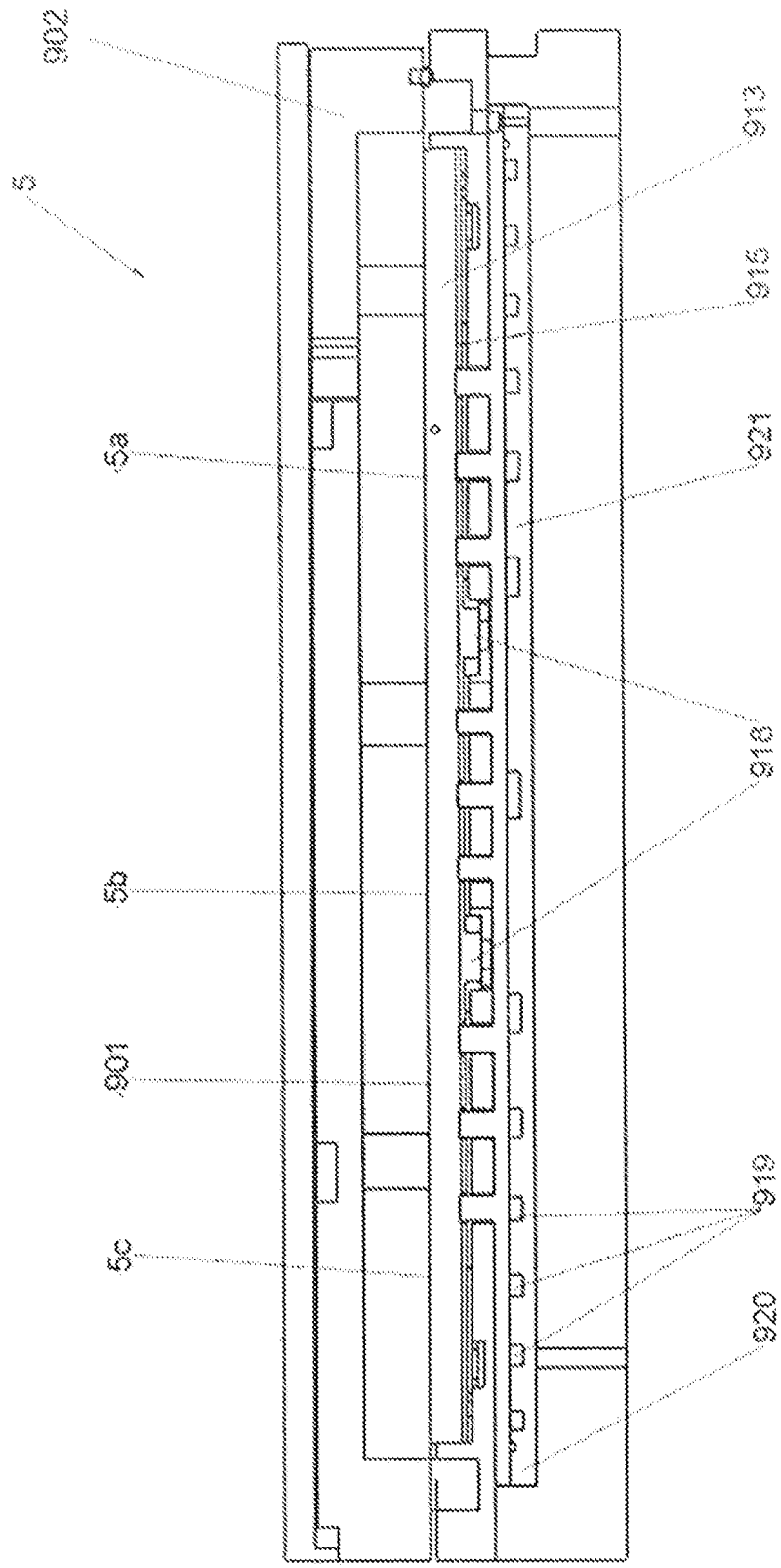
FIG. 4 is a cross sectional view of a soak station provided in an assembly of FIGS. 1a and 1b.

FIG. 4 provides a cross sectional view of the soak station 5. The soak station comprises a surface 901 on which the three zones 5a-c are defined. The soak surface 901 is enclosed by an insulation cover 902 (which comprises insulation material) to minimize thermal losses out of the three zones 5a-c. There is provided a heating and/or cooling means 918,920; the heating means 918 is defined by an electrical silicon heater mat 918 which is attached (e.g. by glue) to an under-surface 915 of plate 913. The cooling means 920 comprises a plate member 921 having channels 919 defined therein which contain gaseous nitrogen. It will be understood that the soak station 5 may have any suitable heating and/or cooling means.

Figure 6:
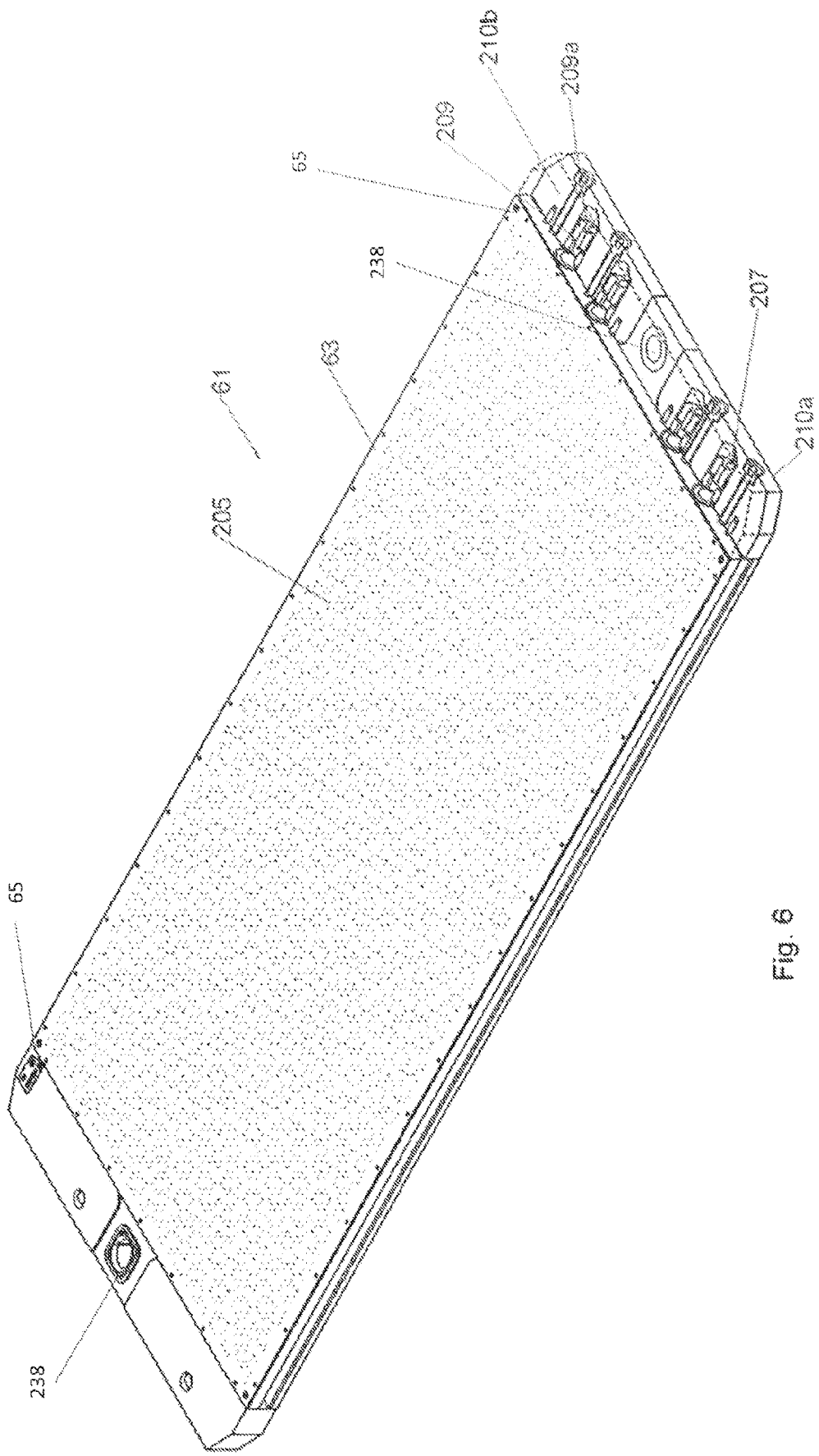
FIG. 6 provides a perspective views of a boat which can be used in any of the assemblies shown in FIGS. 1a,b and 5a,b.
Figure 7:
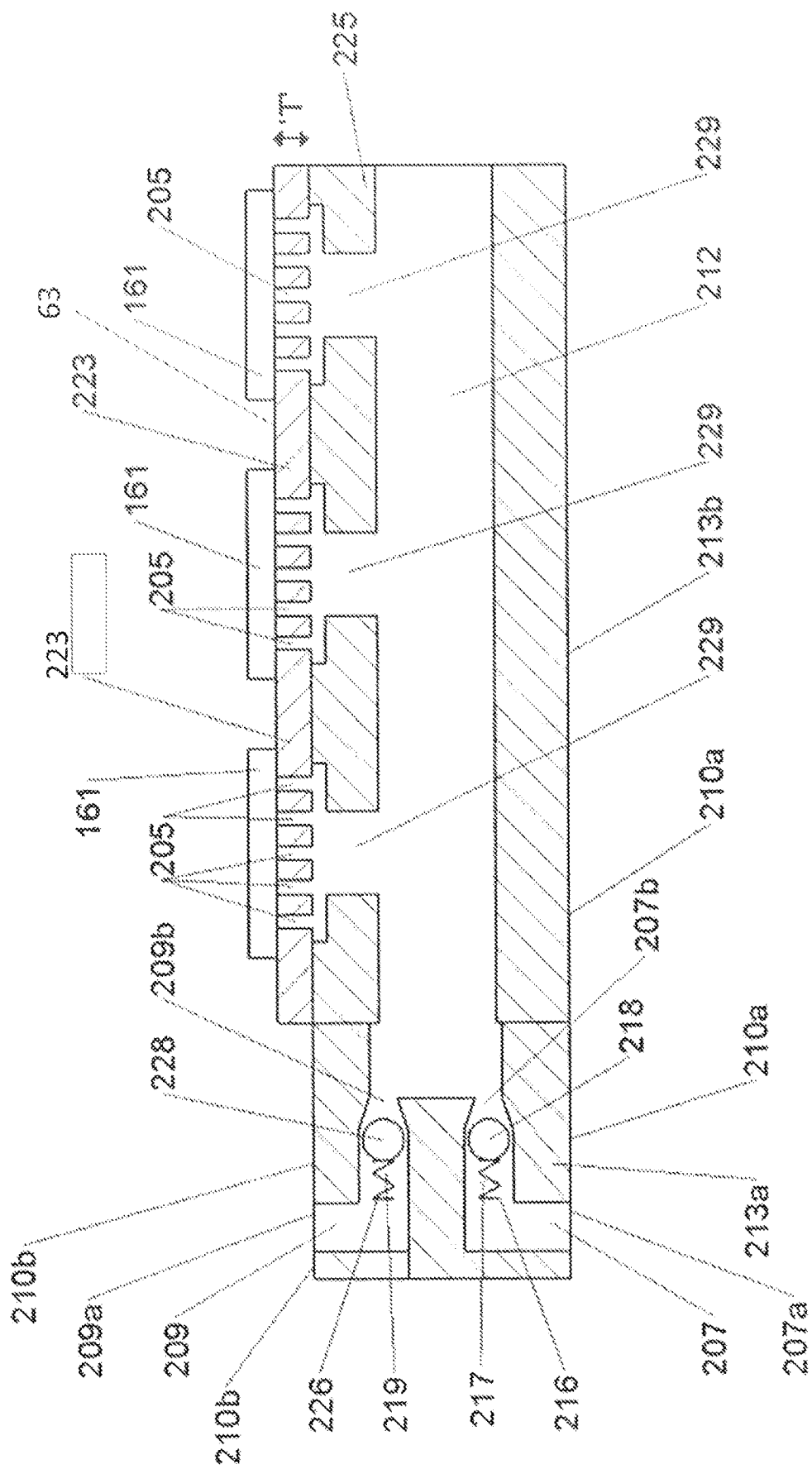
FIG. 7 provides a simplified longitudinal section view of part of the boat shown in FIG. 6.

FIG. 6 provides a perspective view of a boat 61 which can be used in any assembly according to the present invention (with a part of the boat 61 show in transparent for illustration purposes). FIG. 7 provides a simplified longitudinal section view of part of the boat 61 in FIG. 6 and like features are awarded the same reference numbers. FIG. 7 illustrates a plurality of devices 161 supported on the surface 63 of the boat 61.

Referring to FIGS. 6 and 7 it can be seen that the boat 61 comprises, a surface 63 on which a plurality of device (not shown) can be supported. The surface 63 has a plurality holes 205 defined therein through which a vacuum can pass to hold devices on the surface 63. The apertures 238 defined in the boat 61, which are to receive respective alignment pins 75a,b at the flipping station 3 so that the boat 61 can be aligned into a predefined orientation in the flipping station 3, are also illustrated in FIG. 6. FIG. 6 also illustrates that the boat 61 comprises fiducials 65; the defines 161 on the boat 61 collectively form a pattern (e.g. the perimeter of the devices 161 collectively may be rectangular shaped, or circular shaped) the fiducials 65 are used to determine if the pattern of devices 161 on the boat 61 has a predefined position on the boat 61 (e.g. to determine if rectangular shape, or circular shape, has a predefined position on the boat 61).

A first vacuum inlet 207 is provided in fluid communication with the plurality of holes 205. The first vacuum inlet 207 can be selectively fluidly connected to a first vacuum generating means (not shown) so that the first vacuum generating means can provide a vacuum at the plurality of holes 205. In this example the first vacuum inlet 207 is configured to have an input 207a located at an under-surface 210a of the boat 61.

A second vacuum inlet 209 is provided in fluid communication with the same plurality of holes 205 with which the first vacuum inlet 207 is in fluid communication. The second vacuum inlet 209 can be selectively fluidly connected to a second vacuum generating means (not shown) so that the second vacuum generating means can provide a vacuum at the plurality of holes 205. In this example the second vacuum inlet 209 is configured to have an input 209a located at a top-surface 210b of the boat 61.

Referring to FIG. 7 the first vacuum inlet 207 is shown to have an input 207a located at an under-surface 210a (a portion of the boat is shown as transparent so that the input 207a is visible). The second vacuum inlet 209 is configured to have an input 209a located at a top-surface 210b of the boat 61.

During a device handling process, for example, the first vacuum inlet 207 may be fluidly connected to a first vacuum generating means and the second vacuum inlet 209 may be simultaneously fluidly connected to a second vacuum generating means, so that the first vacuum generating means and second vacuum generating means simultaneously provide a vacuum at the same plurality of holes 205. At other stages in the device handling process only the first vacuum inlet 207 may be fluidly connected to a first vacuum generating means (and the second vacuum inlet 209 is not fluidly connected to the second vacuum generating means) so that the vacuum at the hole 205 is provided exclusively by the first vacuum generating means, and/or only the second vacuum inlet 209 may be fluidly connected to a second vacuum generating means (and the first vacuum inlet 207 is not fluidly connected to the first vacuum generating means) so the vacuum at the holes 205 is provided exclusively by the second vacuum generating means. An example of such a device handling process will be described in more detail later.

Continuing to refer to FIG. 7, it can be seen that the boat 61 comprises a single vacuum chamber 212 which is in fluid communication with the holes 205 defined in the surface 63. The first vacuum inlet 207 and the second vacuum inlet 209 are each in fluid communication with said single vacuum chamber 212.

A first check valve 217 is arranged between the input 227a and an output 227b of first vacuum inlet 207 and the second check valve 219 is arranged between the input 9a and output 9b of the second vacuum inlet 9. The first check valve 217 is operable to control the fluid flow (such as the flow of vacuum) from the first vacuum inlet 207 into the single vacuum chamber 212 and the second check valve 219 is operable to control the fluid flow (such as the flow of vacuum) from the second vacuum inlet 209 into the single vacuum chamber 212. The first check valve 217 comprises a first biasing means in the form of a first spring 16 which biases a first plug member 218 towards plugging the output 7b of first vacuum inlet 207. The first plug member 218 is configured such that it will prevent fluid communication between the first vacuum inlet 207 and the single vacuum chamber 212 when it plugs the output 207b of the first vacuum inlet 207. The first plug member 218 is movable, by providing a vacuum in the first vacuum inlet 207, to become unplugged from the output 207b to allow fluid communication (e.g. a vacuum) between the first vacuum inlet 207 and the single vacuum chamber 212. The second check valve 219 comprises a second biasing means in the form of a second spring 226 which biases a second plug member 228 towards plugging the output 209b of the second vacuum inlet 209. The second plug member 228 is configured such that it will prevent fluid communication between the second vacuum inlet 209 and the single vacuum chamber 212 when it plugs the output 209b of the second vacuum inlet 209. The second plug member 228 is movable, via vacuum in the second vacuum inlet 209, to become unplugged from the output 209b to allow fluid communication (e.g. a vacuum) between the second vacuum inlet 209 and the single vacuum chamber 212. In the example illustrated in FIG. 7 the first and second plug members 218,228 are shown as ball-shaped members, however it will be understood that the first and second plug members 218,228 may take any suitable shape, configuration or design which will enable the plug members 218,228 to prevent fluid communication through the respective outputs 207b, 209b when biased by the respective springs 216,226 to plug the outputs 207b, 209b. Likewise the first and second biasing means are shown to be in the form of springs 216,226 however it will be understood that any suitable biasing means may be used.

In this example the boat 61 is configured to be modular, comprising a first modular piece 213a which comprises the first vacuum inlet 207 and second vacuum inlet 209 and a second modular piece 213b which comprises the surface 63 which has a plurality holes 205 and a single vacuum chamber 212 (FIG. 6 also illustrated the first and second modular pieces 213a, 213b); the first modular piece 213a is shown in cross section in FIGS. 1a and 1b for clarity. As shown in FIG. 6, the first and second modular pieces 213a,213b are attached to one another via fasteners.

In the exemplary embodiment shown in FIG. 7 the surface 63 is defined by a metal layer 223. Preferably metal layer 223 has a thickness 'T' of between 0.3 mm-2 mm; and preferably the metal layer 223 comprises sheet metal. The metal layer 223 may comprise any suitable material such as aluminium alloys, steel, copper alloys, glass, silicon, for example. The holes 205 are defined in the metal layer 223. Preferably the holes 205 are formed in the metal layer 223 by drilling or etching. The metal layer 223 has a planar profile.

As illustrated in FIG. 7 the surface 63 on which the plurality of devices 161 is supported has a planar profile or a substantially planar profile. The surface 63 does not extend above a plane of the devices 161 which are supported on the surface 63. This is in contrast to the boats of the prior art which comprise cavities defined in their surface; each of the cavities being dimensioned so that it can receive a respective device; each cavity is dimensioned to receive a device of a specific dimension, accordingly different boats need to be used to carry different devices of different dimensions: For example in the prior art a boat having cavities with length 2 mm, width 2 mm and depth of 0.5 mm can be used to support devices of dimensions 1 mm*2 mm*2 mm (i.e. 1 mm in thickness; 2 mm in length; and 2 mm in width); however such a boat would not be suitable to support devices of dimensions 1 mm*3 mm*3 mm (i.e. 1 mm in thickness; 3 mm in length; and 3 mm in width) since the devices would not fit into the respective cavities provided on the boat;

Advantageously in the present invention the surface 63 on which the plurality of devices 161 is supported has a planar profile or a substantially planar profile; this allows devices of various dimensions and shapes to be supported on the surface 63 and allows the devices to be placed in various patterns on the surface 63. The boat of the present invention is not restricted to support devices of a specific dimension; specifically unlike the boats of the prior art the boat of the present invention is not restricted to support only devices which can fit within cavities provided on the surface of the boat.

The boat 61 further comprises a support layer 225 on which the metal layer 223 is mounted. The support layer 225 provides mechanical support to the metal layer 223. The support layer 225 has a plurality of conduits 229 defined therein; the conduits 229 are configured to fluidly connect one or more holes 205 in the metal layer 223 with the single vacuum chamber 212. In the example illustrated in FIG. 7 each conduit 229 fluidly connects five holes 205 in the metal layer 223 with the single vacuum chamber 212; however it will be understood the conduits 229 may be configured to fluidly connect any number of holes 205 with the single vacuum chamber 212, for example each conduit 229 may be configured to fluidly connect a single hole 5 with the single vacuum chamber 212.

Preferably the support layer 225 comprises material with a conductivity above 40 W/(m K) advantageously this facilitates heat transfer from beneath the boat 61 (e.g. from the under-surface 210a of the boat 61 to devices 161 supported on the surface 63 of the boat 61. Most preferably the support layer 225 comprises aluminium alloys, steel, copper alloys.

Figure 8:
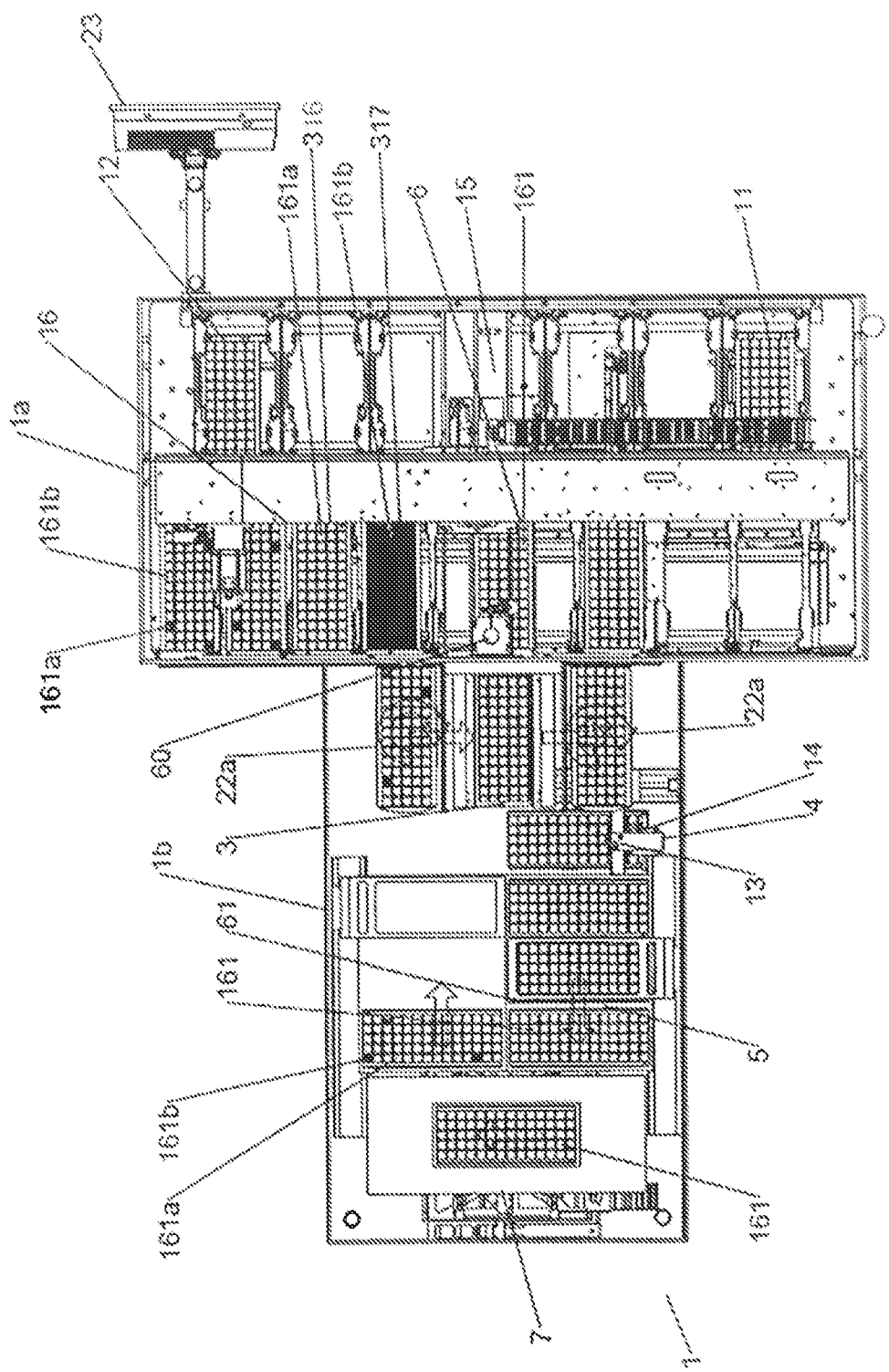
FIG. 8 provides a magnified plan view of the assembly shown in FIGS. 1a,b.

The assembly 1 can be used to perform a method according to further aspect of the present invention. The steps of the method will be described with reference to FIG. 8 which shows a magnified plan view of assembly 1:

During use a tray 6 on which there is supported devices 161 which are to be tested is moved by the shuttle 15 from the input stack 11 in the input-output module 1a into the flipping station 3 of the test module 1b. Simultaneously to moving the tray 6 into the flipping station 3 the tray 6 and devices 161 are scanned by a scanning camera 60 which is interposed between the input-output module 1a and flipping station 3. Image data provided by the scanning camera 60 is processed by the vision computer 23, to determine one or more of: the number of devices 161 on the tray 6, the type of devices 161 on the tray 6, if any of the devices 161 on the tray 6 are displaced from respective predefined positions, a code provided on each device 161. The scanning camera 60 may be a linear scan camera for example. The vision computer 23 can be determined from the image data if any devices 161 are missing from the tray by determining if the number of devices is equal to a predefined number, and/or the vision computer 23 can determine from the image day if a device is displaced (e.g. two devices overlapping so that they occupy the same position) by comparing each of the device positions to a predefined reference pattern (the reference pattern showing the positions which each individual device should occupy on the surface of the boat, and/or the vision computer 23 can determine from the image if all the devices are a predefined type of devices by reading a device code on each device using the camera. This check can be done initially at the tray 6 is initially being passed into the flipping station 3 (i.e. before testing) and also as the tray is leaving the flipping area 3 (i.e. after the devices have been tested).

Figure 10A:
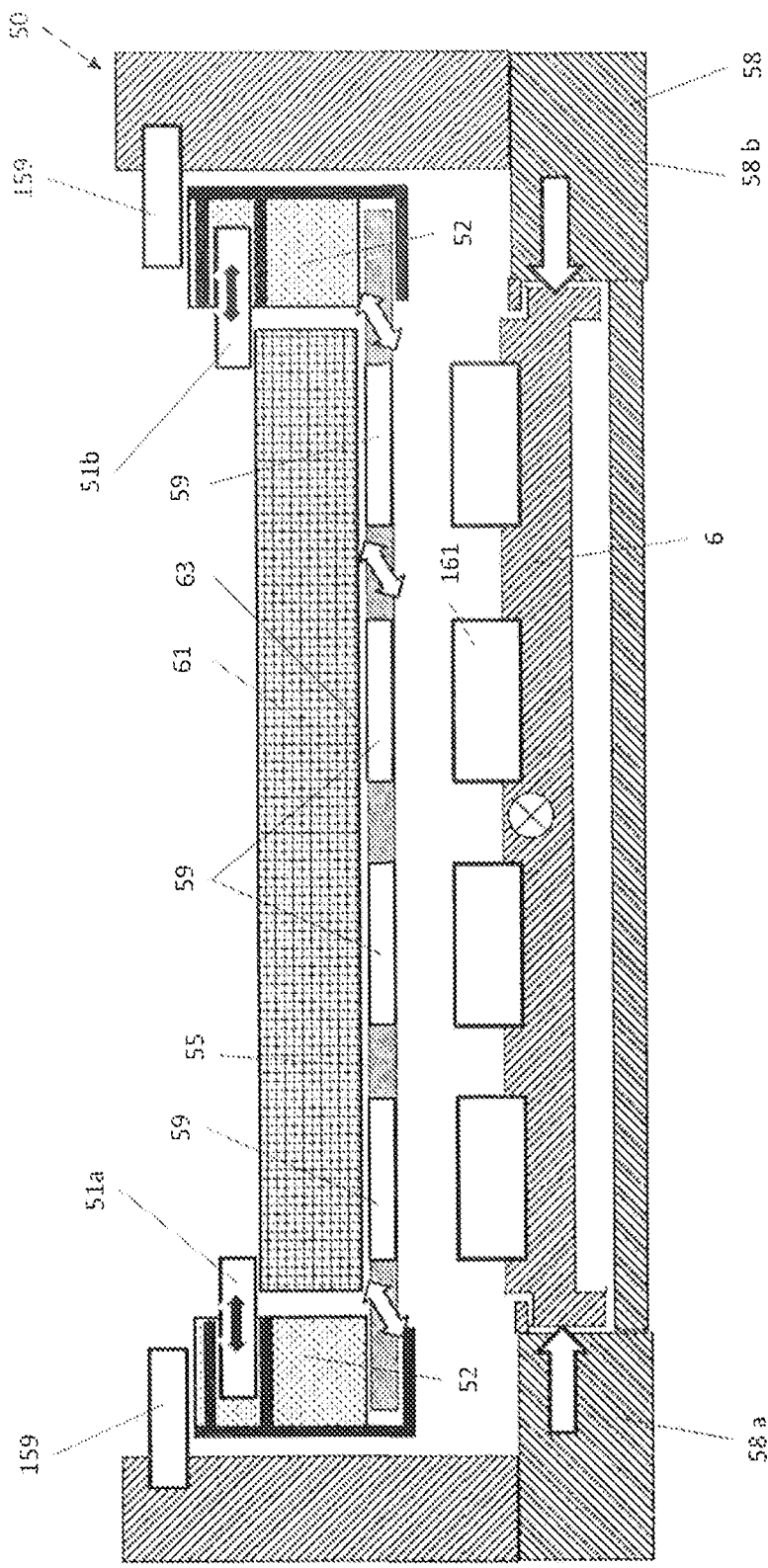

FIGS. 10a-e illustrate the steps which are performed at the flipping station 3 in order to transfer devices, which are due to be tested, from a tray 6 to a surface 63 of an empty boat 61:

Referring first to FIG. 10a, a tray 6 on which there is supported devices 161 which are to be tested are supported is slid-horizontally into the flip member 50 of the flipping station 3. More specifically, one of the alignment pins 75a is retracted into the hole 79 in the platform 71 of the flip member 50 so as to allow a tray 6 to be slid horizontally along the surface 70 of the platform 71 of the flip member 50. The shuttle 15 will move the tray 6, on which there is supported devices 161 which are to be tested, so that it is slid horizontally into the flip member 50 so that it positioned beneath a surface 63 of the boat 61 and it located between the jaws 58a,b of the clamp 58, as is shown in FIG. 10a. The tray 6 is slid horizontally along the surface 70 of the platform 71 of the flip member 50 until it abuts the other alignment pin 75b. Once the tray 6 abuts other alignment pin 75b, the retracted alignment pin 75a is then extended from the hole 79 so that the tray 6 is held between the two alignment pins 75a,b.

Typically there will be a boat 61, which has a surface 63 on which devices 161 can be supported, already present in the flipping station 3 as the tray 6 is received into the flipping station 3; the boat 61 which is in the flipping station 3 is empty so that it is capable to receive onto its surface 63 the devices 161 which are on the tray 6. More specifically, an empty boat 61 will be already be present in the flip member 50 before the tray 6 is moved into the flip member 50. After the tray 6 has been moved to abut other alignment pin 75b, and the retracted alignment pin 75a has been extended from the hole 79 so that the tray 6 is held between the two alignment pins 75a,b, the positioning of the boat 61 within the flip member 50 is then adjusted. The boat 61 is moved until the two alignment pins 75a,b have been received into respective apertures 238 provided in the boat 61, so that the boat 61 is orientated in a predefined position within the flip member 50. The predefined position is such that the boat 61 is aligned with the tray 6.

In this embodiment it should be noted that a grid 55 is also already present in the flip member 50 before the tray 6 is moved into the flip member 50. The grid 55 is held at opposite sides by the first holder member 52a and a second, opposite, holder member 52b, of the holder 52. The grid 55 is arranged so that each of the cut-outs 59 in the grid 55 substantially overlay a respective device 161 on the tray 6; and the gird 55 is arranged so that it underlays the surface 63 of the boat 61. The empty boat 61 is clamped between the pins 51a,51b which are extended from the respective first and second holder members 52a,b, and the grid 55.

Figure 10B:
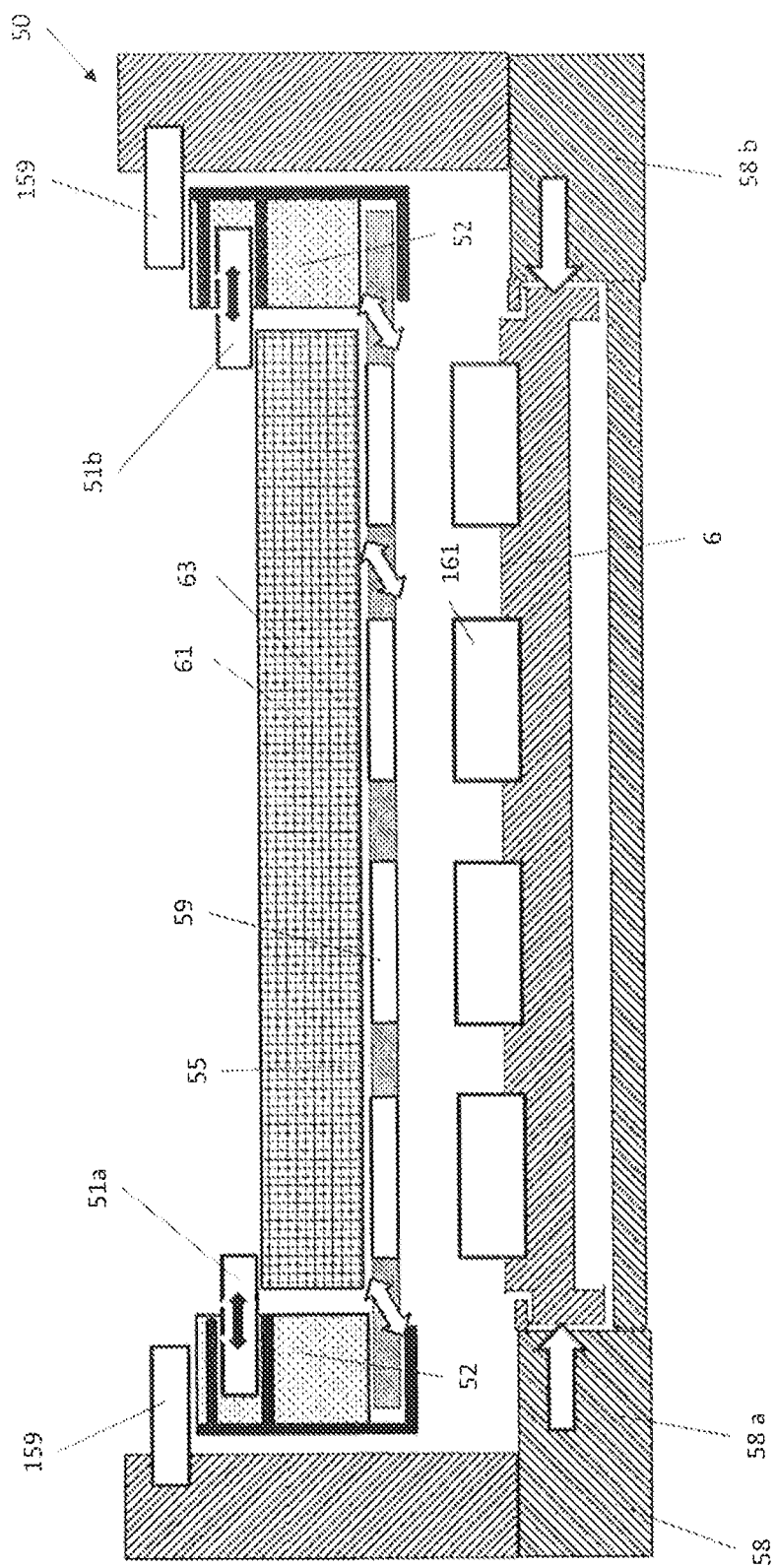
Figure 10E:
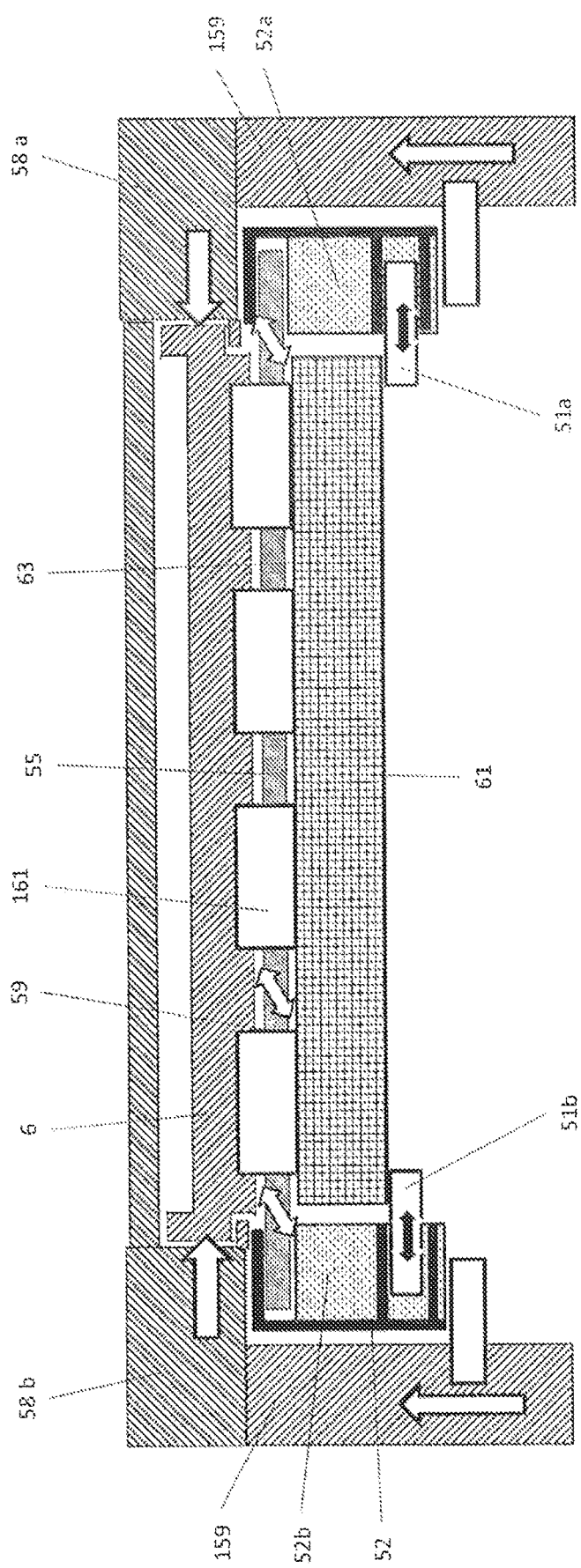
Figure 10G:
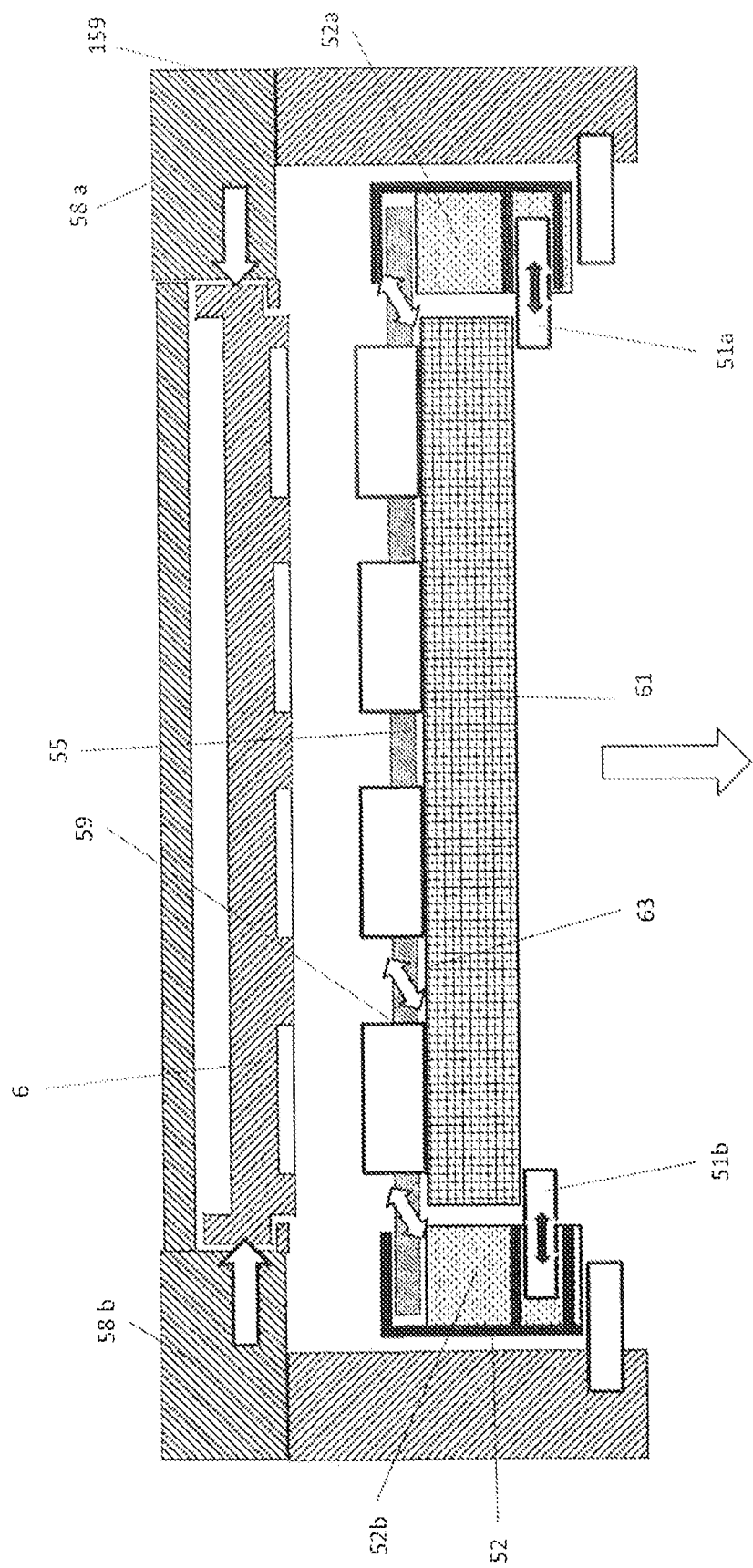

Once the tray 6 has been slid horizontally into the flip member 50, the tray 6 is then centred within the flip member 50, as illustrated in FIG. 10b. The centering of the tray 6 centers the tray 6 between the jaws 58a,b of the clamp 58. After the tray 6 is centred the jaws 58a,b of the clamp are simultaneously moved towards the tray 6 so as to clamp the tray 6 between the opposing jaws 58a,b.

Next, as is illustrated in FIG. 10c, the pneumatic or servo driven lift 159 is operated to selectively move the holder 52, and thus the grid 55 which is held by the holder 52 and the boat 61 which is clamped between the pins 51a,b and the grid 55, in a first direction towards the clamp 58 to form a first stack 22a. The boat 61, grid 55 and tray 6 collectively define a first stack 22a. The devices 161 which are supported on the tray 6 are now sandwiched between the tray 6 and a surface 63 of the boat 61 which can support devices. Preferably the pneumatic or servo driven lift 159 moves the holder 52, and thus the grid 55 and boat 61, until at least a portion of each device 161 on the tray 6 protrudes into a respective cut-out 59 in the grid 55.

It should be understood that in one embodiment the pneumatic or servo driven lift 159 is operated to selectively move the holder 52, and thus the grid 55 which is held by the holder 52 and the boat 61 which is clamped between the pins 51a,b and the grid 55, until the surface 63 of the boat 61 abuts the devices 161 which are supported on the tray 6, so that the boat 61 and tray 6 simultaneously abut the devices 161 when the first stack 22a is formed. However in the most favourable embodiment there is an gap between the surface 63 of the boat 61 and devices 161; in this more favourable embodiment the first stack 22a includes an airgap between the surface 63 of the boat 61 and the devices 161 that are supported on the tray 6 and this airgap is maintained as the first stack 22a is flipped—when the first stack 22a is flipped the devices 161 fall away from the tray 6, under the influence of gravity, across the airgap, to become supported on the surface 63 of the boat 61. The grid 55 may be located in the airgap; and there may be a gap between the grid 55 and tray 6 and another gap between the grid 55 and the surface 63 of the boat 61.

As illustrated in FIG. 10d, after the first stack 22a has been from, the first stack 22a is then flipped by 180°, so that the tray 6 is now positioned over the surface 63 of the boat 61, to cause the devices 161 to fall, under the influence of gravity, away from the tray 6 and through the respective cut-outs 59 in the grid 55, to become supported on the surface 63 of the boat 61, thereby transferring the devices 161 from the tray 6 to the surface 63 of the boat 61. The flipping of the first stack 22a is achieved by moving the pneumatic or servo driven lift 159 around the along substantially circular track 300.

After the first stack 22a has been flipped the grid 55 and the boat 61 are vibrated to cause each of the devices 161 to abut a predefined edge of a respective cut-out 59 in the grid 55, thereby moving all of the devices 161 into respective predefined positions on the surface 63 of the boat 61. FIG.

10e illustrates the grid 55 and the boat 61 being vibrated; the direction of the vibration being indicated by the arrows; it can be seen that in this example the grid 55 and the boat 61 being vibrated in a direction which is 45° to the planes of the grid 55 and boat 61. However it will be understood that the vibration could be in any other suitable direction. In another embodiment only the grid 55 is vibrated after the first stack 22a has been flipped; and in another embodiment the whole first stack 21a is vibrated, after flipping. FIG. 10f illustrates another example in which the whole first stack 22a is vibrated; it can be seen that in this example the first stack 22a is vibrated in a direction which is 45° to the plane of the boat 61.

Figure 11A:
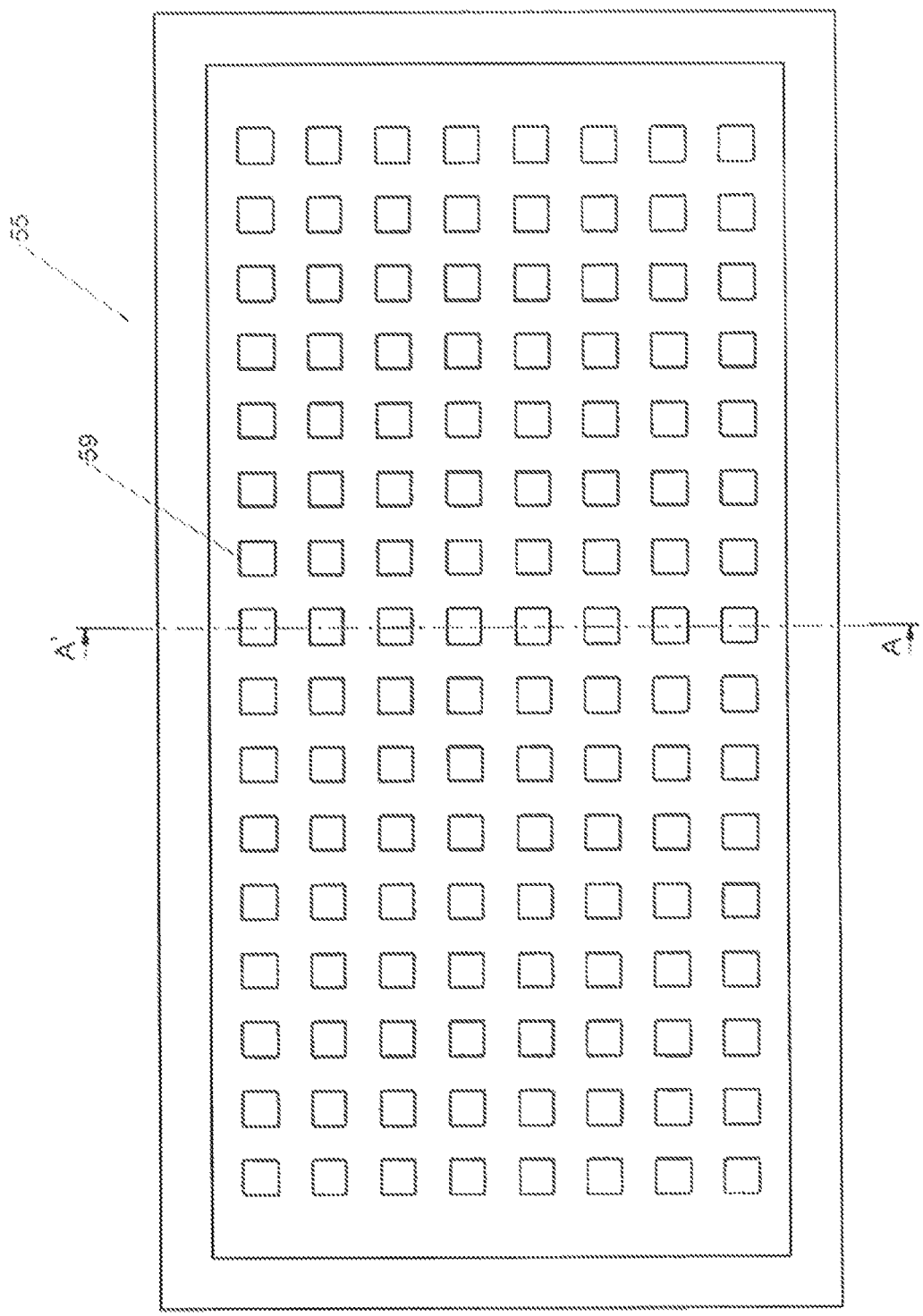
FIG. 11a is a plan view of an exemplary grid having cut-outs defined therein.
Figure 11B:
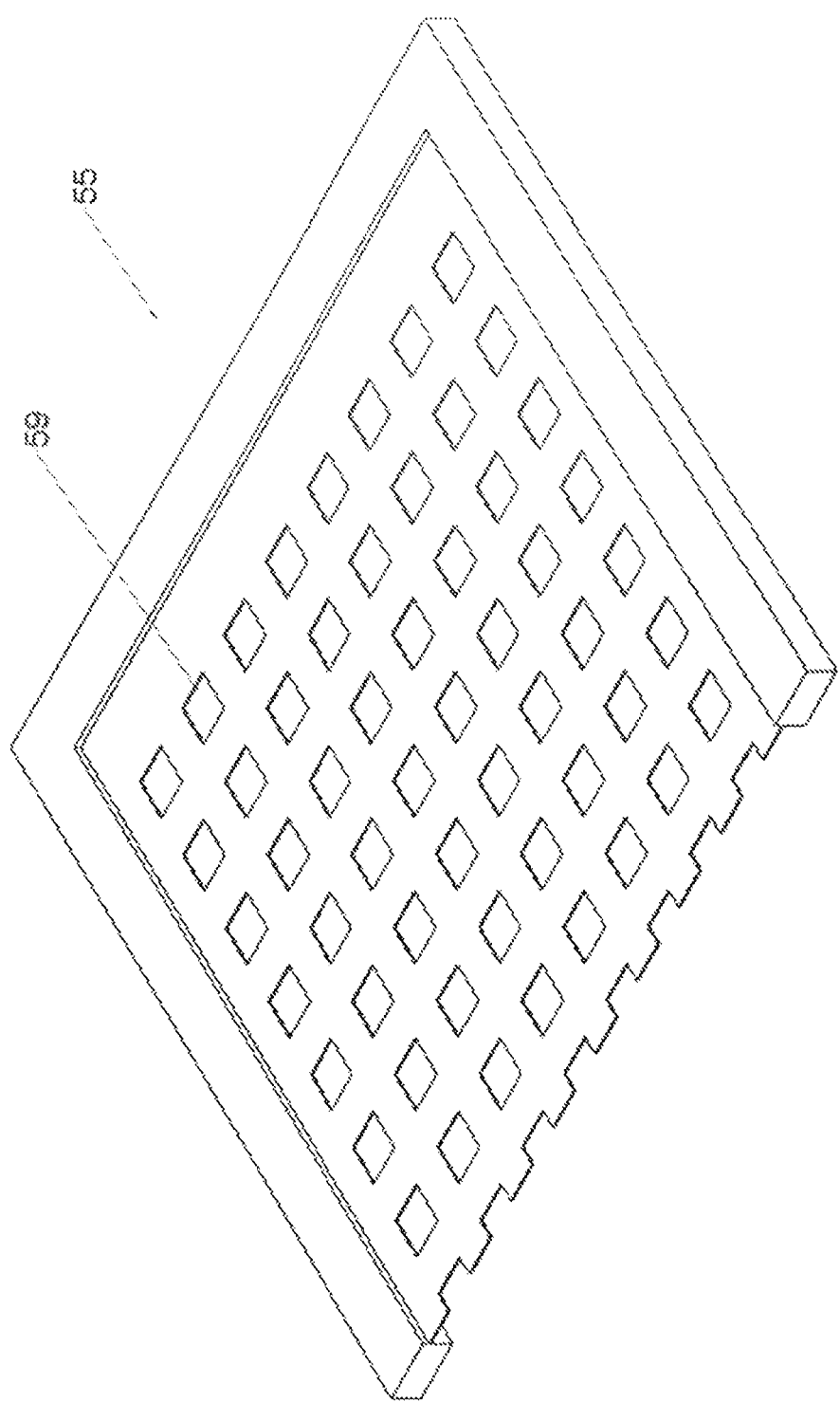
Figure 11C:
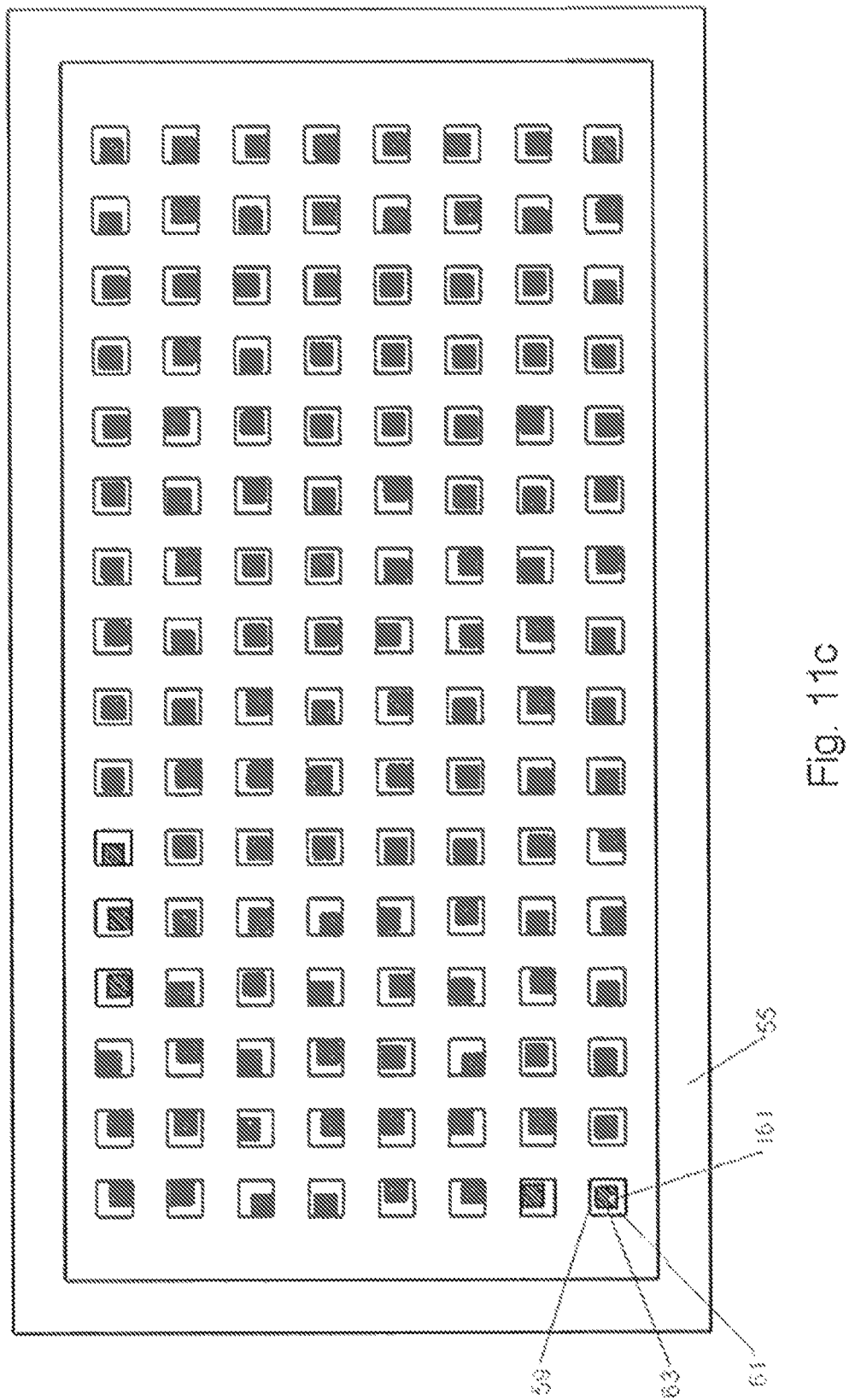
FIG. 11c is a plan view illustrating the position of devices after flipping and before vibration of the first stack/grid.
Figure 11D:
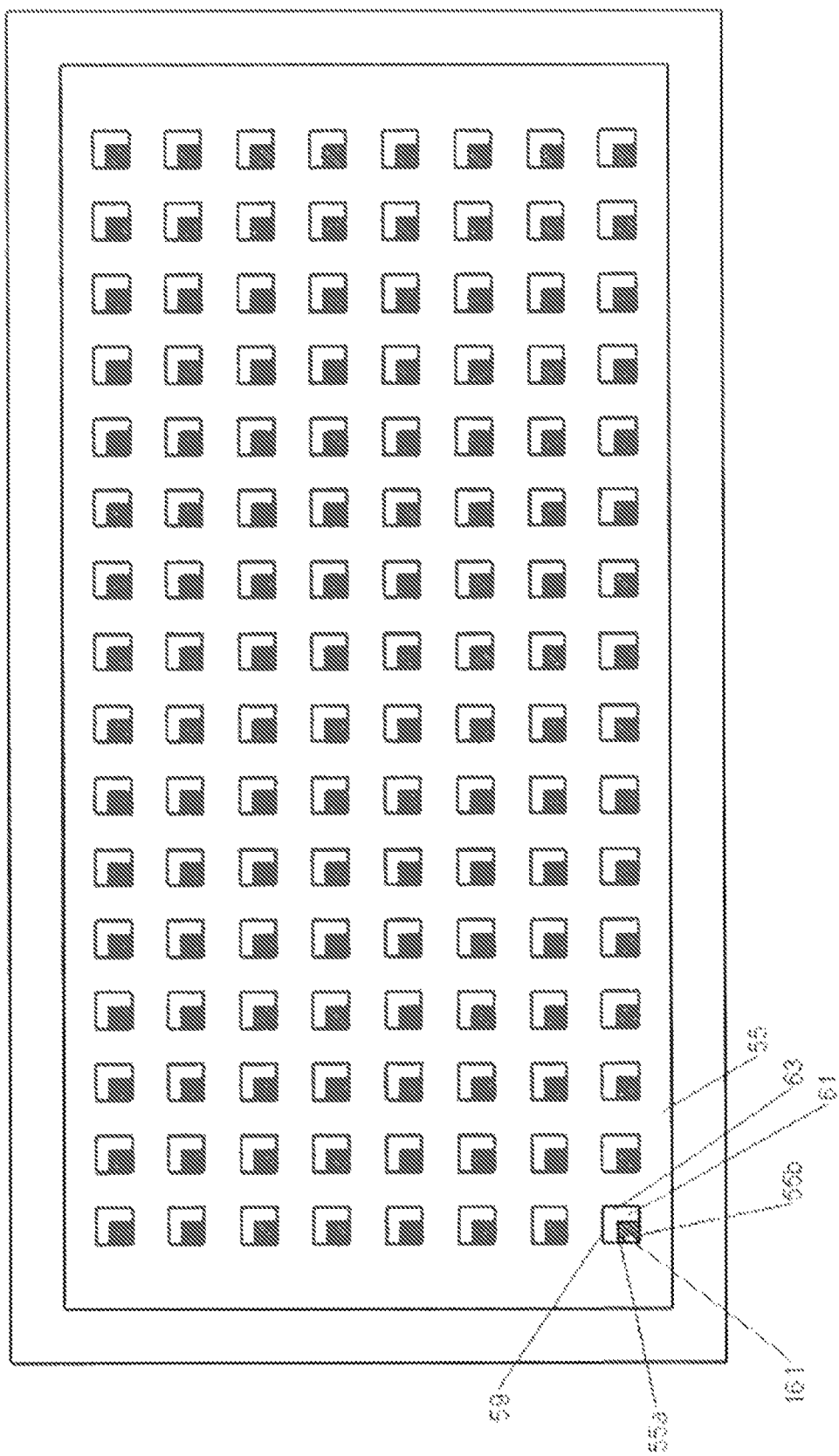
FIG. 11d is a plan view illustrating the position of devices after vibration, whereby the first stack/grid has been vibrated to move devices to abut edges of respective cut-outs, to move the devices into a predefined position on the boat.

FIG. 11a shows a plan view, and FIG. 11b shows a cross-sectional perspective view (taken along line A-A' of FIG. 11a), of an exemplary grid 55 that may be used in the present invention. The grid 55 is shown to have a plurality of cut-out's 59 defined therein. The dimensions of the cut-out's 59 is larger than the dimensions of the devices 161 so as to allow the devices 161 to pass through the respective cut-outs 59 during flipping. FIG. 11c illustrate the grid 55 immediately after the first stack 22a has been flipped; as can be seen the device 161 are at random positions on the surface 63 of the boat 61—this is indicated by the device 161 occupying a random orientation with a respective cut-out 59 of the grid 55. FIG. 11d illustrate the grid 55 after the first stack 22a has been flipped and after subsequent vibration of the grid 55 (and boat 61 which is beneath the grid 55) to cause each of the devices 161 to abut a left-most edge 55a and lower edge 55b of a respective cut-out 59. The direction of vibration of the grid 55 (and boat 61) is indicated by the arrows. When the devices 45 have been moved to abut the predefined edges 55a,55b of respective cut-outs 59 in the gird 55 then all of the devices 161 will occupy respective predefined positions on the surface 63 of the boat 61. It should be understood that the grid 55 and the boat 61 can be vibrated to cause each of the devices 161 to abut any edge of a respective cut-out 59; most preferably the grid 55 and the boat 61 are vibrated to cause each of the devices 161 to abut the same edge(s) of each respective cut-out 59. It will also be understood the same results will be achieved in the embodiment in which only the grid 55 is vibrated and also in the embodiment in which the whole first stack 22a is vibrated.

After the grid 55 and the boat 61 have been vibrated to cause each of the devices 161 to abut a predefined edge of a respective cut-out 59 in the grid 55, thereby moving all of the devices 161 into respective predefined positions on the surface 63 of the boat 61, next a vacuum is applied to the devices 161, via the holes 205 provided defined in the surface 63 of the boat 61, which sucks the devices towards the surface 63 of the boat 61. The vacuum will hold the devices in their respective predefined positions on the surface of the boat 61. Most preferably, in order to reduce the possibility of a device becoming displaced from its predefined position, the vacuum is applied to the devices immediately after the vibration of the grid 55 and boat 61 has ceased. In order to apply a vacuum which holds the devices 161 in position on the surface 63 of the boat, the first vacuum inlet 207 and/or the second vacuum inlet 209 is/are fluidly connected to a vacuum generating means; the vacuum generating means is operated to provide negative air pressure which is transmitted to the holes 205 in the surface 63 via the single vacuum chamber 212.

With the devices 161 now held in position on the surface 63 of the boat 61 by means of the vacuum, the pin 51a,b are retracted into their respective first and second holder member 52a,b so that the boat 61 is released from the flip member 50.

Referring back to FIG. 8, with the boat 61 now released from the flip member 50 and the devices 161 held in position on the surface 63 of the boat 61 by means of the vacuum, the boat 61 (and the devices supported on its surface) is then moved to the inspection/alignment station 4. The boat 61 is moved to be positioned on the rotatory table 38. The camera 14 at the inspection/alignment station 4 captures a wide angled view image showing all the devices on the boat and fiducials 65 which are on the boat; the pattern which the group of devices 161 collectively form on the boat 61 (i.e. the perimeter of the devices 161 e.g. a rectangular pattern, or circular pattern) should have a predefined orientation with respect to the fiducials 65 which are on the boat 61 (so that the group of devices 161 have a predefined orientation on the boat 61). The vision computer 23 processes the wide angled view image to determine if the group of devices 6, are orientated in a predefined position; for example the group of devices 161 may be arranged to form a rectangular pattern on the boat 61, and the predefined orientation for that rectangular pattern may be that the respective corners of the rectangle should aligned with a respective fiducial 65; thus the vision computer 23 processes the wide angled view image to determine if the image shows that the corners of the respective corners of the rectangular pattern of devices are aligned with a respective fiducial 65.

In another example the devices 161 may be positioned so that collectively they form in rectangular pattern on the boat 61 and the boat may comprise two linear fiducials; the vision computer 23 will process the wide angled view image to determine if each of the sides of the rectangular pattern is parallel with the respective linear fiducials on the boat to determine if the group of devices is in a predefined orientation on the boat 61. This is essentially a global alignment check to see if the pattern defined by all devices collectively is correctly orientated on the boat.

In addition to the global alignment check the individual position of each of the devices on the boat 61 may also be checked; in this case the camera 14 at the inspection/alignment station 4 moves along orthogonal support arms 39a,39b to scan (i.e. capture a narrow angled view image) of each of the devices 161 individually which are supported on the surface 63 of a boat 61; image data is provided by the camera 14 to the process 23 and the vision computer 23 processes the image data to determine if any of the devices 161 which are supported on the surface 63 of the boat 61 are displaced from a respective predefined position. Typically the vision computer 23 will determine if an individual device 161 is displaced by comparing the position of the device shown in the image to a reference image or stored reference pattern or map, which shows a device the predefined position.

If the vision computer 23 determines that pattern defined by all devices collectively is offset from the fiducials on the boat, then the pickup head 13 at the inspection/alignment station 4 is moved to pick all devices 161 consecutively from the boat 61 and to replace the devices 161 onto the surface 63 of the boat 61 so that the pattern formed by the devices collectively is aligned with the respective fiducials on the boat. Likewise, if the processor determines that any individual devices 161 are displaced from their respective predefined positions, then the pickup head 13 at the inspection/alignment station 4 is moved to pick (preferably consecutively) each displaced device 161 and to replace the device 161 onto the surface 63 of the boat 61 in a position corresponding to the predefined position which that device 161 should have (i.e. in a position corresponding to the position of the device shown in reference image, a position corresponding to a stored reference pattern or map).

In one example the vision computer 23 processes the wide angled view image to determine from the image the offset between the pattern of devices and the fiducials 65 on the boat 61; if the offset is below a predefined threshold then the pattern of devices 161 will be deemed to be in the correct position on the surface 63 of the boat 61; if however the wide angled view image shows that the offset between the pattern of devices and the fiducials 65 on the boat 61 is greater than the predefined threshold then the pattern of devices 161 will be deemed to be displaced from its predefined position and pick up head 13 will be moved, along the support arms 39a,39b, to be positioned above each device 161 in the pattern, and will pick each device 161 and subsequently place each device 161 on the boat 61 again so that the pattern of devices in an corrected orientation on the boat 61 (i.e. the pattern of devices is aligned with the fiducials 65 on the boat 61.

Likewise in one example the vision computer 23 processes the narrow angled view image to determine from the image the offset between the position of the device shown in the image and the position of the device shown in the reference image; if the offset is below a predefined threshold then the position of the device 161 will be deemed to be in the correct position on the surface 63 of the boat 61; if the processor determine the offset is above the predefined threshold then the position of the device 161 will be deemed to be in the incorrect position on the surface 63 of the boat 61 and pick up head 13 will be moved, along the support arms 39a,39b, to be positioned above the displaced device 161, and will pick each device 161 and subsequently place the device 161 on the boat 61 so that it is in the correct predefined position. This may be done for each individual device on the boat 61.

In another embodiment the pickup head 13 can be used to reposition some or all of the devices on the surface of the boat so that the devices are arranged in a predefined pattern (e.g. in a pattern selected by the user).

After the inspection/alignment station 4, the boat 61 is then moved into the soak station 5 and is arranged to occupy one of the three zones. In the soak station 5 the heating means 25 is operated to heat the devices 161 which are on the boat 61 to a predefined temperature for testing.

The afore-mentioned steps of flipping at the flipping station 3, inspection at the inspection/alignment station 4, are repeated until a further two boats 61 are arranged to occupy the remaining two zones in the soak station 5 so that the soak station 5 is fully populated.

After the soak station 5 is fully populated the boat 61 which has been longest in the soak station 5 (which at this point is the boat 61 which was first moved into the soak station 5) is moved to the test station 7. At the test station 7 the boat 61 is moved onto the plunger head 71 of the plunger 17. The plunger 17 is then operated to move a boat 61 into an x, y, z, Theta plunger unit 107 where testing of the devices 161 on the boat 61 is performed.

As the devices 161 on the boat 61 are being tested at the x, y, z, Theta plunger unit 107, another boat 61 which has undergone flipping at the flipping station 3 and inspection at the inspection/alignment station 4 is moved into the zone which was vacated by the boat 61 which is currently undergoing testing at the testing station 7.

After the devices 161 on the boat have been tested at the testing station 7, the boat 61 is then moved to the flipping station 3, and the next boat which has been longest at the soak station 5 is moved onto the plunger head 71 of the plunger 7 where it is moved into the x, y, z, Theta plunger unit 107 where testing of the devices on the boat is performed. As before, as the devices 161 on the boat 61 are being tested at the x, y, z, Theta plunger unit 107, another boat 61 which has undergone flipping at the flipping station 3 and inspection at the inspection/alignment station 4 is moved into the zone which was vacated by the boat which is currently at the testing station 7. The steps of moving the boat 61 which has been longest in the soak station 5 into the testing station 7 and moving another boat 61 into the vacated zone is repeated until a predefined number of boats 61 have been heated at the soak station 5 and their devices 161 tested at the testing station 7.

As mentioned after the devices 161 on the boat have been tested at the testing station 7, the boat 61 is then moved to the flipping station 3 where flipping can take place to transfer the tested devices from the boat 61 to an empty tray 6. FIGS. 12a-d illustrate the steps which are performed at the flipping station 3 in order to transfer devices which has already undergone testing, from the surface 63 of the boat 61 to a tray 6:

An empty tray 6 which is to receive the tested device 61 is slid-horizontally into the flip member 50 of the flipping station 3. More specifically, one of the alignment pins 75a is retracted into the hole 79 in the platform 71 of the flip member 50 so as to allow a tray 6 to be slid horizontally along the surface 70 of the platform 71 of the flip member 50. The shuttle 15 will move the tray 6, so that it is slid horizontally into the flip member 50 so that it located between the jaws 58a,b of the clamp 58. The tray 6 is slid horizontally along the surface 70 of the platform 71 of the flip member 50 until it abuts the other alignment pin 75b. Once the tray 6 abuts other alignment pin 75b, the retracted alignment pin 75a is then extended from the hole 79 so that the tray 6 is held between the two alignment pins 75a,b.

Once the empty tray 6 has been slid horizontally into the flip member 50, the tray 6 is then centred within the flip member 50. The centering of the tray 6 centers the tray 6 between the jaws 58a,b of the clamp 58. After the tray 6 is centred the jaws 58a,b of the clamp are simultaneously moved towards the tray 6 so as to clamp the tray 6 between the opposing jaws 58a,b. It should be noted that the two alignment pins 75a,b restrict movement in one direction while during the centering step the tray 6 is moved along a direction which is perpendicular to the direction which the alignment pins 75a,b restrict movement.

In a preferred embodiment the empty tray 6 will be already positioned in the flip member 50 before the boat 61 which supports tested devices 161 on its surface 63, is moved from the testing station 7 to the flipping station 3.

In this embodiment it should be noted that a grid 55 is already present in the flip member 50 before the boat 61 is moved from the testing station 7 to the flipping station 3. In the flip member 50, the grid 55 is held at opposite sides by the first holder member 52a and a second, opposite, holder member 52b, of the holder 52.

Figure 12A:
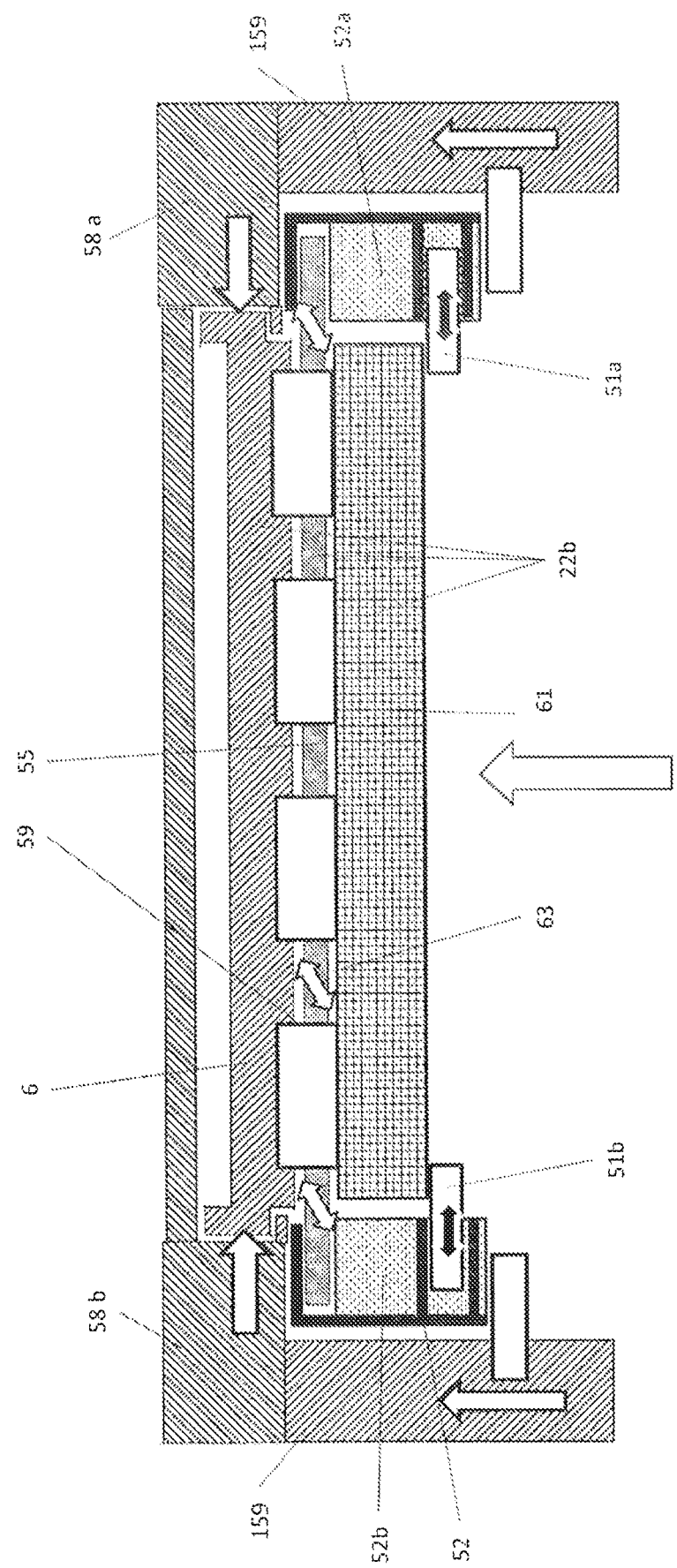
FIG. 12a-d illustrate the steps which are performed at the flipping station in order to transfer tested devices from a boat to an empty tray.

Next the pins 51a,51b are retracted into their respective first and second holder members 52a,b, and the boat 61 which supports tested devices 161 on its surface 63 is moved between the respective first and second holder members 52a,b so that the boat 61 abuts the grid 55. The pins 51a,b are then extended from their respective first and second holder members 52a,b, so that the boat 61 is clamped between the pins 51a,51b and the grid 55, as is shown in FIG. 12a.

The positioning of the boat 61 is then adjusted. The boat 61 is moved until the two alignment pins 75a,b have been received into respective apertures 238 provided in the boat 61, so that the boat 61 is orientated in a predefined position within the flip member 50. The predefined position is such that the boat 61 is aligned with the tray 6. The grid 55 is arranged so that when the boat has been moved into its predefined position, each of the cut-outs 59 in the grid 55 substantially overlay a respective device 161 on the boat 61.

Next, the pneumatic or servo driven lift 159 is operated to selectively move the holder 52, and thus the grid 55 which is held by the holder 52 and the boat 61 which is clamped between the pins 51a,b and the grid 55, in a second direction towards the clamp 58 to form a second stack 22b. The boat 61, grid 55 and tray 6 collectively define a second stack 22b. The tested devices 161 which are supported on the tray 6 are now sandwiched between the tray 6 and a surface 63 of the boat 61. Preferably the grid 55 is arranged so that each of the cut-outs 59 in the grid 55 substantially overlay a respective device 161 on the surface 63 of the boat 61; and the pneumatic or servo driven lift 159 moves the holder 52, and thus the grid 55 and boat 61, until at least a portion of each tested device 161 on the tray 6 protrudes into a respective cut-out 59 in the grid 55.

It should be understood that in one embodiment the pneumatic or servo driven lift 159 is operated to selectively move the holder 52, and thus the grid 55 which is held by the holder 52 and the boat 61 which is clamped between the pins 51a,b and the grid 55, until a surface of the tray 6 abuts the tested devices 161 which are supported on the surface 63 of the boat 61, so that the boat 61 and tray 6 simultaneously abut the tested devices 161 when the second stack 22b is formed. However in the most favourable embodiment there is an gap between the tray 6 and tested devices 161; in this more favourable embodiment the second stack 22b includes an airgap between the tray 6 and the tested devices 161 that are supported on the surface 63 of the boat 61, and this airgap is maintained as the first stack 22a is flipped—when the second stack 22b is flipped the tested devices 161 fall away from the surface 63 of the boat 61, under the influence of gravity, across the airgap, to become supported on the tray 6. The grid 55 may be located in the airgap; and there may be a gap between the grid 55 and tray 6 and another gap between the grid 55 and the surface 63 of the boat 61.

Figure 12B:
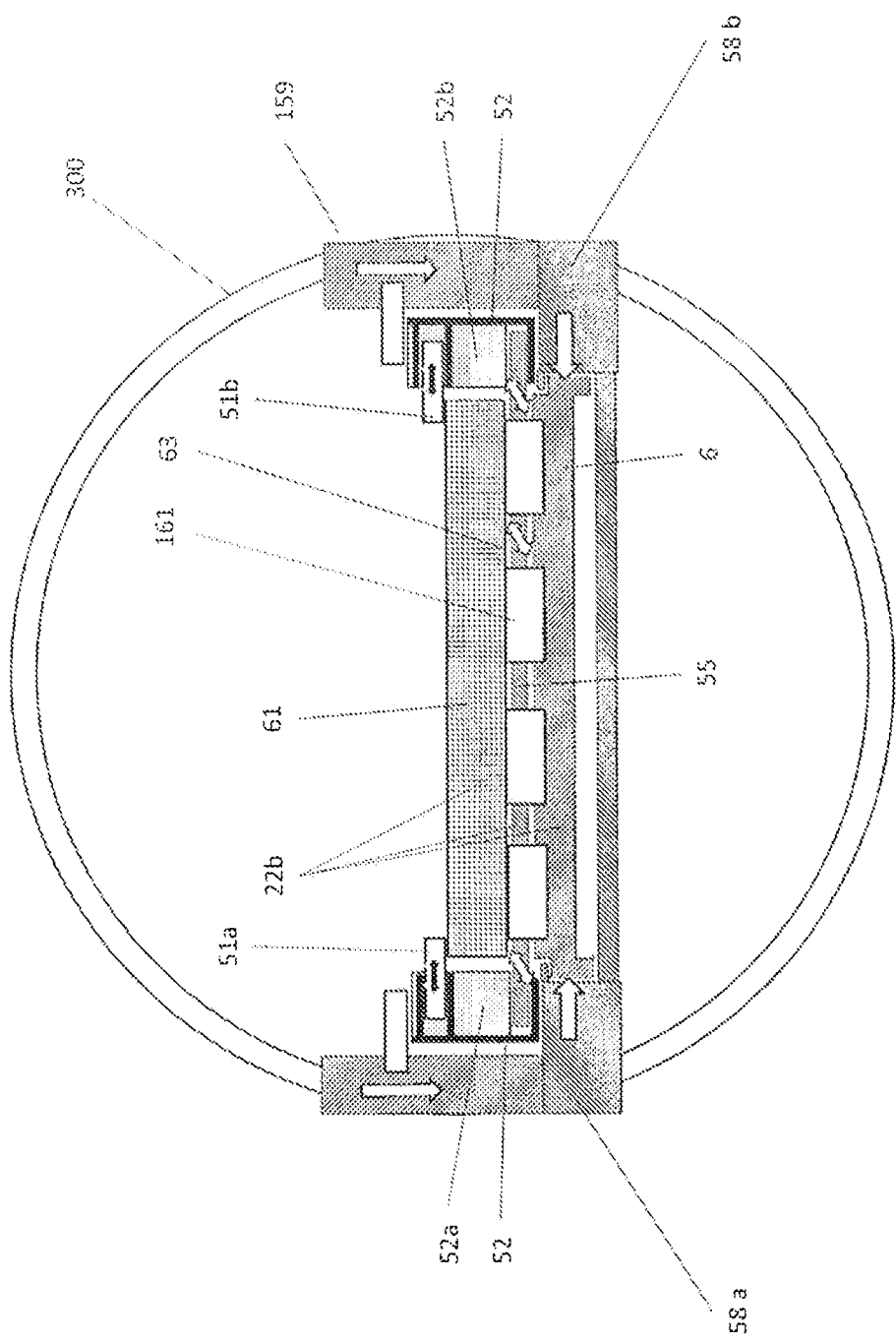

As illustrated in FIG. 12b, after the second stack 22b has been from, the second stack 22b is then flipped by 180°, so that the surface 63 of the boat 61 is now positioned over the tray 6, to cause the tested devices 161 to fall, under the influence of gravity, away from the surface 63 of the boat 61 and through the respective cut-outs 59 in the grid 55, to become supported on the tray 6, thereby transferring the tested devices 161 from the surface 63 of the boat 61 to the tray 6. The flipping of the second stack 22b is achieved by moving the pneumatic or servo driven lift 159 around the along substantially circular track 300.

Either before the second stack 22b is then flipped by 180°, or immediately after the second stack 22b is then flipped by 180°, the vacuum applied to the devices 161, via the holes 205 defined in the surface 63 of the boat 61, is turned off. This allows the tested devices 161 to fall, under the influence of gravity, away from the surface 63 of the boat 61 and through the respective cut-outs 59 in the grid 55.

In this most preferred embodiment the tray 6 will comprise a plurality of pockets; each pocket is configured to hold a respective device 161. When the second stack 22b is flipped the devices 161 fall, under the influence of gravity, away from the surface 63 of the boat 61 and through the respective cut-outs 59 in the grid 55, and are received into respective pockets in the tray 6.

Figure 12C:
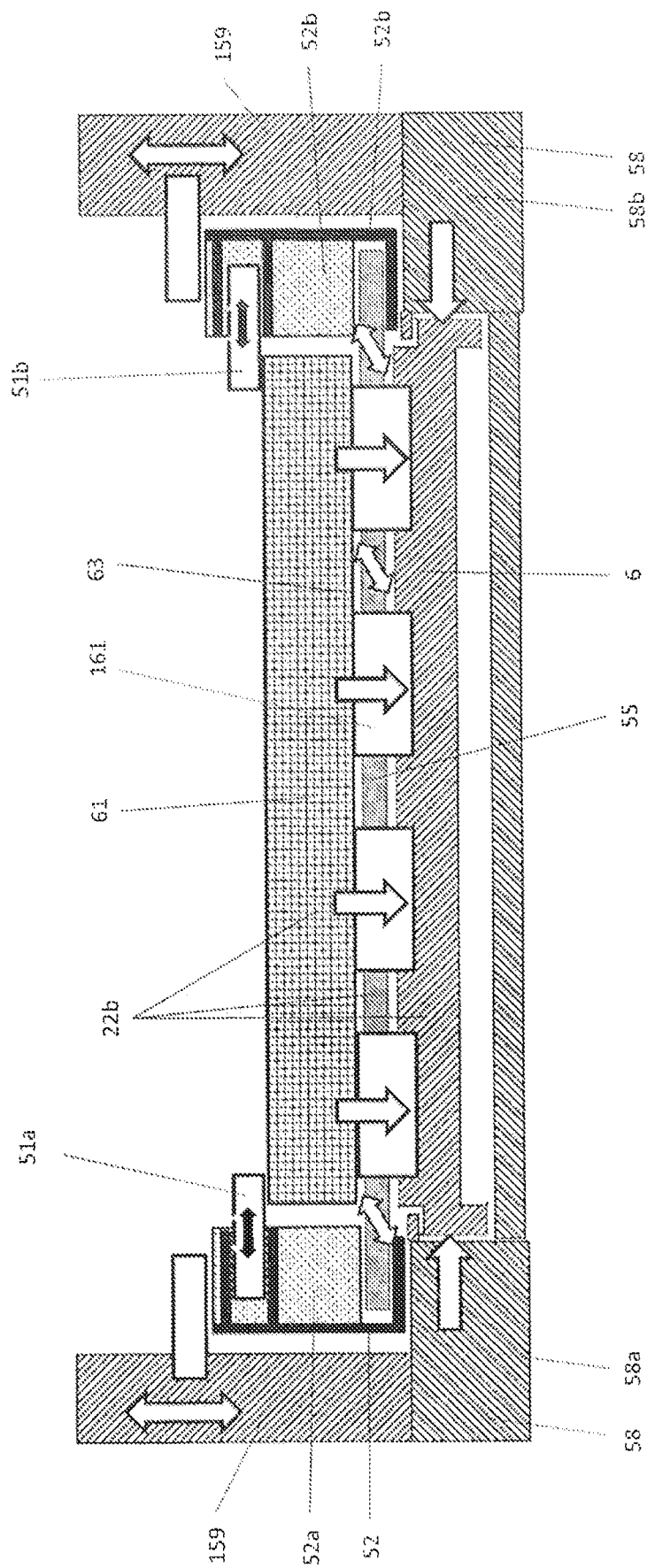

As is illustrated in FIG. 12c, after the second stack 22b has been flipped the grid 55 the whole second stack 22b is vibrated to ensure that the tested devices 161 are correctly seated in the respective pockets which are defined in the tray 6 (e.g. to ensure that the tested devices 161 are fully contained within a respective pocket in the tray 6). Preferably the second stack 22b is vibrated in a direction which is 45° to the plane of the boat 61. In another embodiment only the tray 6 is vibrated and in yet another embodiment only the grid 55 and tray 6 are vibrated.

In another embodiment the grid 55 is arranged so that, after the second stack 22b has been flipped, each of the devices 161 which are supported on the tray 6 project into a respective cut-out 59 in the grid 55. In this embodiment, after the second stack 22b has been flipped, the grid 55 and the tray 6 are vibrated so that each of the devices abuts an edge defining a respective cut-out 59 in the grid 55, so as to move the devices into predefined respective positions on the tray. For example, the vibration of the grid 55 and tray 6 will urge the devices to move into their respective pockets on the tray 6. Thus the vibration of the grid 55 and tray 6 will ensure that the tested devices 161 are properly positioned within their respective pockets in the tray 6.

Figure 12D:
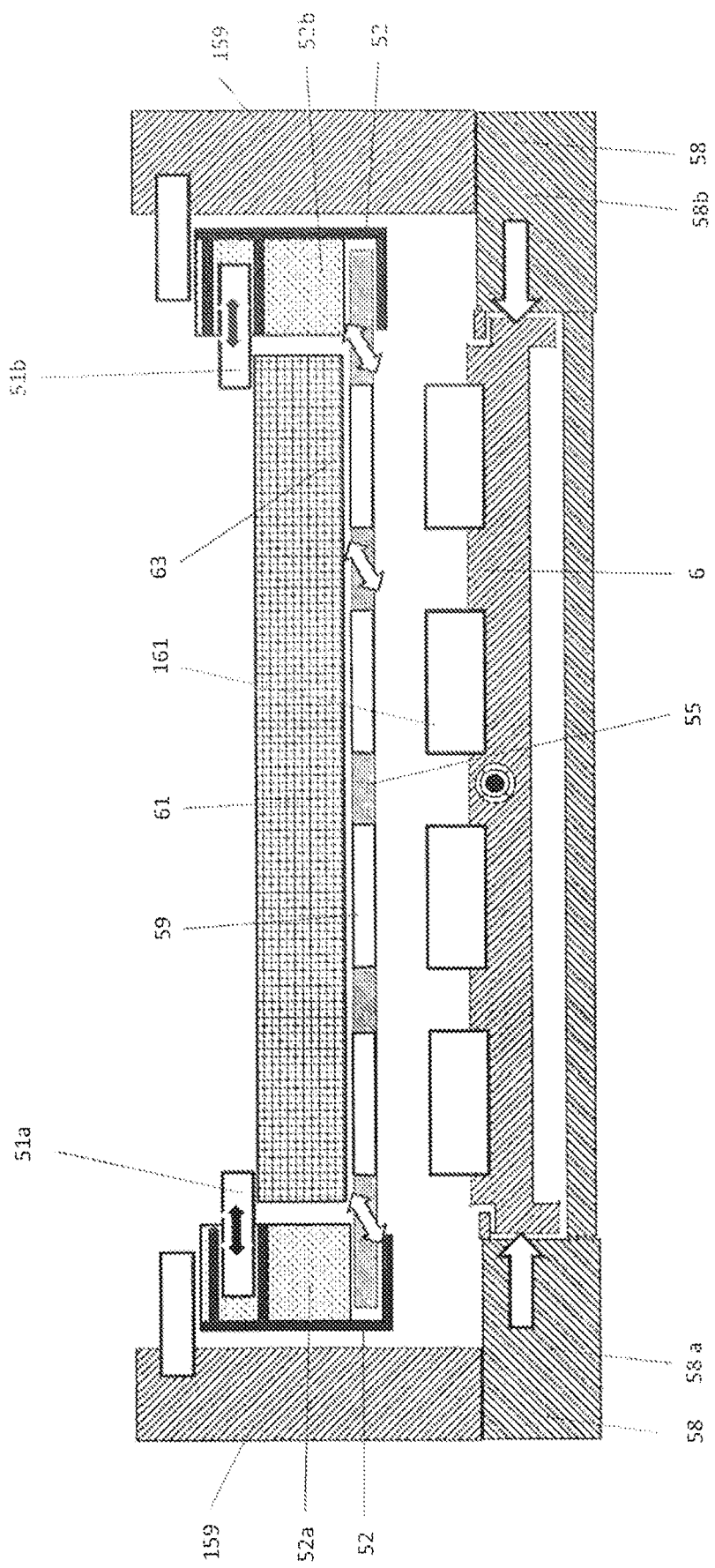

Once the second stack 22b has been vibrated to ensure that the tested devices 161 are correctly seated in respective pockets which are defined in the tray 6, the tray 6 is then slid horizontally out of the flip member 50, as shown in FIG. 12d. The tray 6, which now carries the tested device 161, is slid out of the flip member 50 by the shuttle 15.

The pin 51a,b are retracted into their respective first and second holder member 52a,b so that the empty boat 61 is released from the flip member 50. The empty boat 61 can be reused to carrier devices 161.

In one embodiment the boat 6 is arranged in the flip member 50 so that the tested devices 161 that are supported on the surface 63 of the boat 61 abut the tray 6, so that the empty tray 6 and boat 61 simultaneously abut the devices 161 when the second stack 22b is formed. In a more favourable embodiment however there is an gap between the empty tray 6 and tested devices 161 that are supported on the surface 63 of the boat 61; in this embodiment the second stack 22b includes an airgap between the empty tray 6 and the tested devices 161 that are supported on the surface 63 of the boat 61—and this airgap is maintained as the second stack 22b is flipped—when the second stack 22b is flipped the devices 161 fall away from the surface 63 of the boat 61, under the influence of gravity, across the airgap, to become supported on the tray 6 (e.g. received into respective pockets in the tray). The grid 55 may be located in the airgap; and there may be a gap between the grid 55 and tray 6 and another gap between the grid 55 and the surface 63 of the boat 61. It should also be understood that the use of a grid 55 is not essential to the present invention; in another embodiment the second stack 22b comprises the boat 61 and tray 6 only.

As mentioned after the second stack 22b has been flipped to transfer the devices 161 from the surface 63 of the boat 61 to the tray 6, the tray 6 is exported out of the flipping station 3 by the shuttle 15 into the sorting station 16 of the input-output module 1a. Specifically the shuttle 15 slides the tray horizontally out of the flip member 50. Simultaneously to exporting the tray 6 out of the flipping station 3 the tray 6 and its tested devices 161 are scanned by a scanning camera 60. Image data provided by the scanning camera 60 is processed by a vision computer 23, to determine one or more of, the number of devices on the tray, the type of devices on the tray, if any of the devices on the tray are displaced from respective predefined positions, a code provided on each device. The scanning camera 60 may be a linear scan camera for example. It can be determined from the image data if any devices are missing from the tray, or if there a device is displaced (e.g. two devices overlapping so that they occupy the same position), or it can be determined if all the devices are a predefined type of devices by reading a device code on each device using the camera. The scanning of the devices and image processing was performed previously as a tray carrying the devices 161 was being moved into the flipping station 3—the vision computer 23 may compare the type of devices (determined by reading the device codes which appear in images of the devices captured by the scanning camera 60) which were determined in both the scan which is performed as the tray is being exported from the flipping station 3 with the type of devices determined by the scan which was performed previously as the devices were moved into the flipping station 3 on a tray, to determine if the same devices 161 which entered the testing module 1b are also leaving the testing module 1b.

After the tray has been exported out of the flipping station 3 by the shuttle 15 and into the sorting station 16 of the input-output module 1a, those devices 161b which failed testing at the testing station 7 are then picked from the tray 6. It should be understood that only those devices 161b which failed testing at the test station are picked from the tray 6—those devices 161a which passed testing at the test station 7 remain in the tray 6. Each device 161b which is picked from the tray 6 is replaced with a device 161a which has passed testing at the test station. For example, in the preferred embodiment the assembly comprises a source-tray 316 which comprises only devices 161a which have passed testing at the test station 3. After flipping the second stack 22b to transfer the devices 161 from the surface 63 of the boat 61 to the empty tray 6, devices 161b which failed testing at the test station 7 are picked from the tray 6 to provide a vacant pocket in the tray 6; a replacement device 161a is then picked from a source-tray 316, wherein the source tray 3146 has supported thereon only devices 161a which have passed testing at the test station 7; the replacement device 161a is then positioned into the vacant pocket of the tray 6; these steps are repeated until all the devices 161b which failed testing at the test station 7 have been replaced with a respective replacement device 161a from the source-tray 316. Preferably the devices 161b which failed testing and which are picked from the tray 6 are disposed in a deposition-tray 317 designated to hold devices 161b which failed testing.

In one embodiment when all the replacement devices 161a have been picked from the source-tray 316 so that the source-tray 316 is empty, the empty source-tray 316 is replaced with the last tray 6 to have been exported from the flipping station 3 and which all of the devices supported thereon had passed testing at the test station 7, or which all of the devices supported thereon which failed testing 161b have been replaced with a replacement device 161a from a source-tray 316.

Figure 5A:
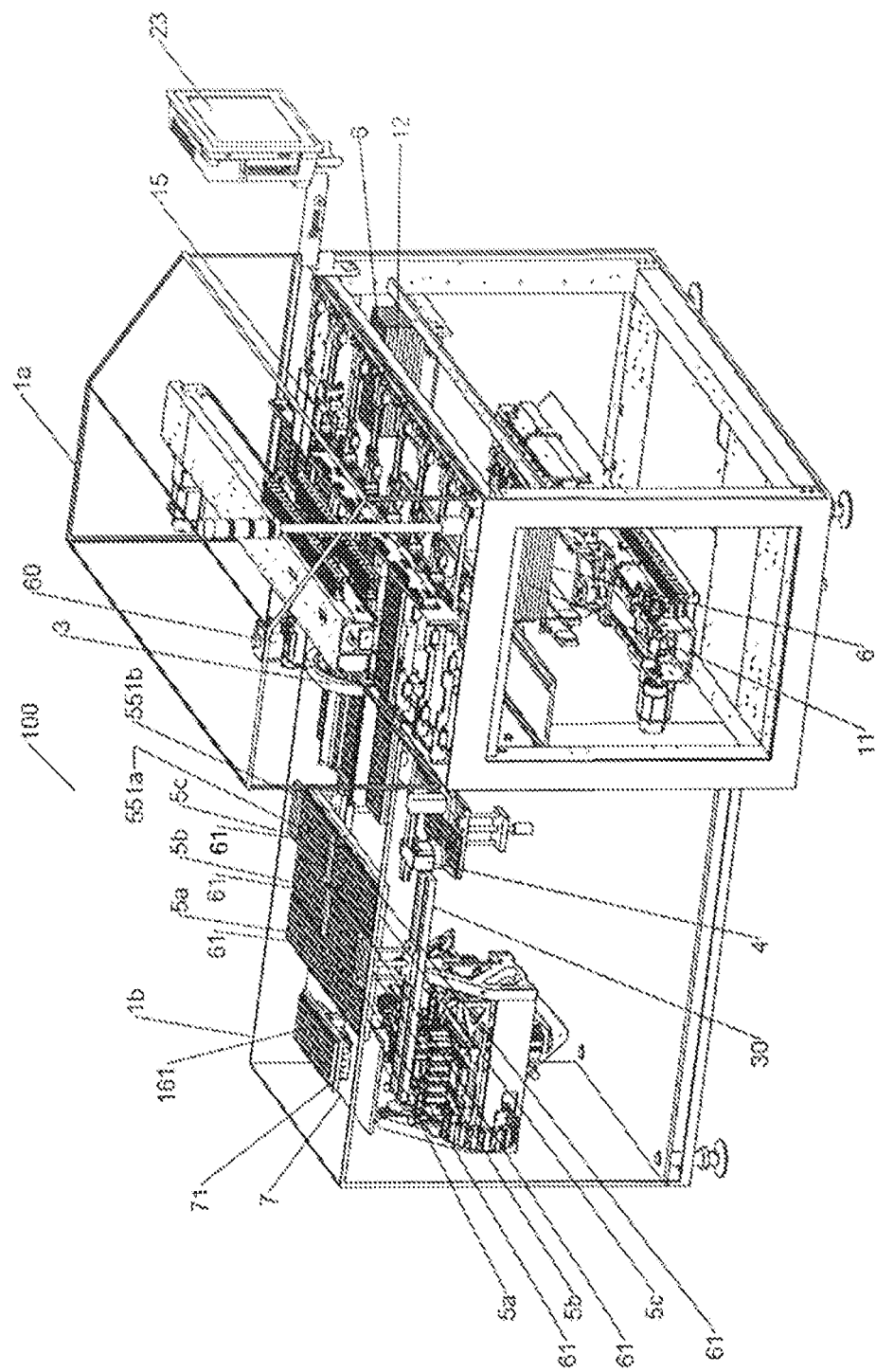
FIG. 5a shows a perspective view of an assembly according to a further embodiment of the present invention which has two soak stations.
Figure 5B:
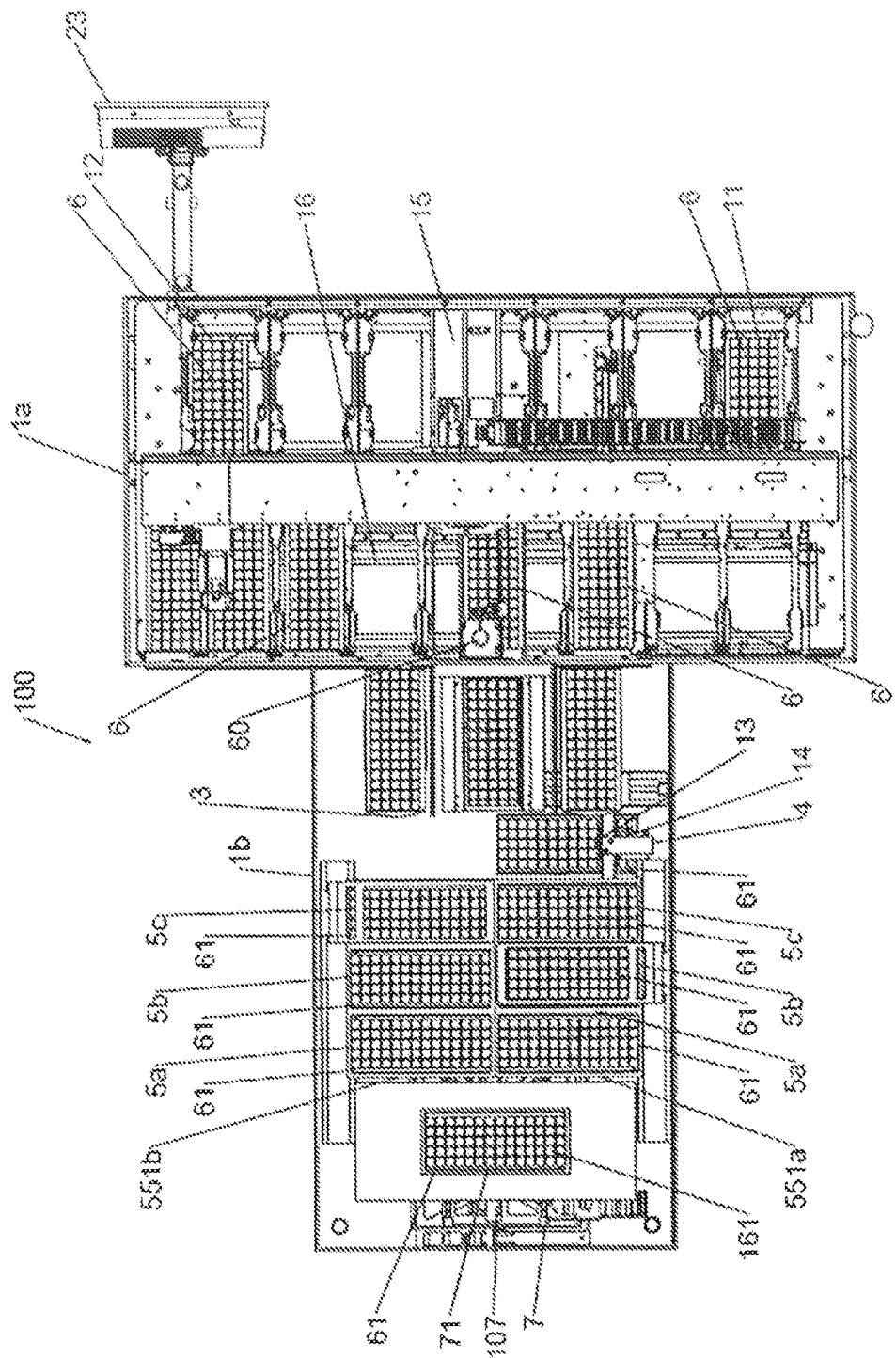

FIG. 5a provides a perspective view of a component handling assembly 100 according to a further embodiment of the present invention; and FIG. 5b provides a plan view of the component handling assembly 100. The assembly 100 has many of the same features as the assembly 1 shown in FIGS. 1a,1b and like features are awarded the same reference numbers.

Unlike the assembly 1, the assembly 100 comprises a first and second soak station 551a, 551b which are arranged equal distance from the test station 7, and are positioned symmetrically with respect to the test station 7. The first and second soak stations 551a,551b are both positioned between the test station 7 and flipping station 3. Each of the first and second soak stations 551a,551b comprises three zones 5a-c, each zone 5a-c can receive a respective boat 61; thus in this example the first soak station 5a can facilitate three boats 61 simultaneously and the second soak station 5b can facilitate three boats 61 simultaneously so that collectively the first and second soak stations 551a,551b can facilitate six boats 61 simultaneously. However it will be understood that the first and second soak stations 551a,551b could be configured to facilitate any number of boats 61. Each of the first and second soak stations 551a,551b comprises heating means which is operable to heat, to a predefined temperature, the devices 161 which are supported on three boats 61 which are located in the respective three zones 5a-c of the respective first and second soak stations 551a, 551b.

Figure 9:
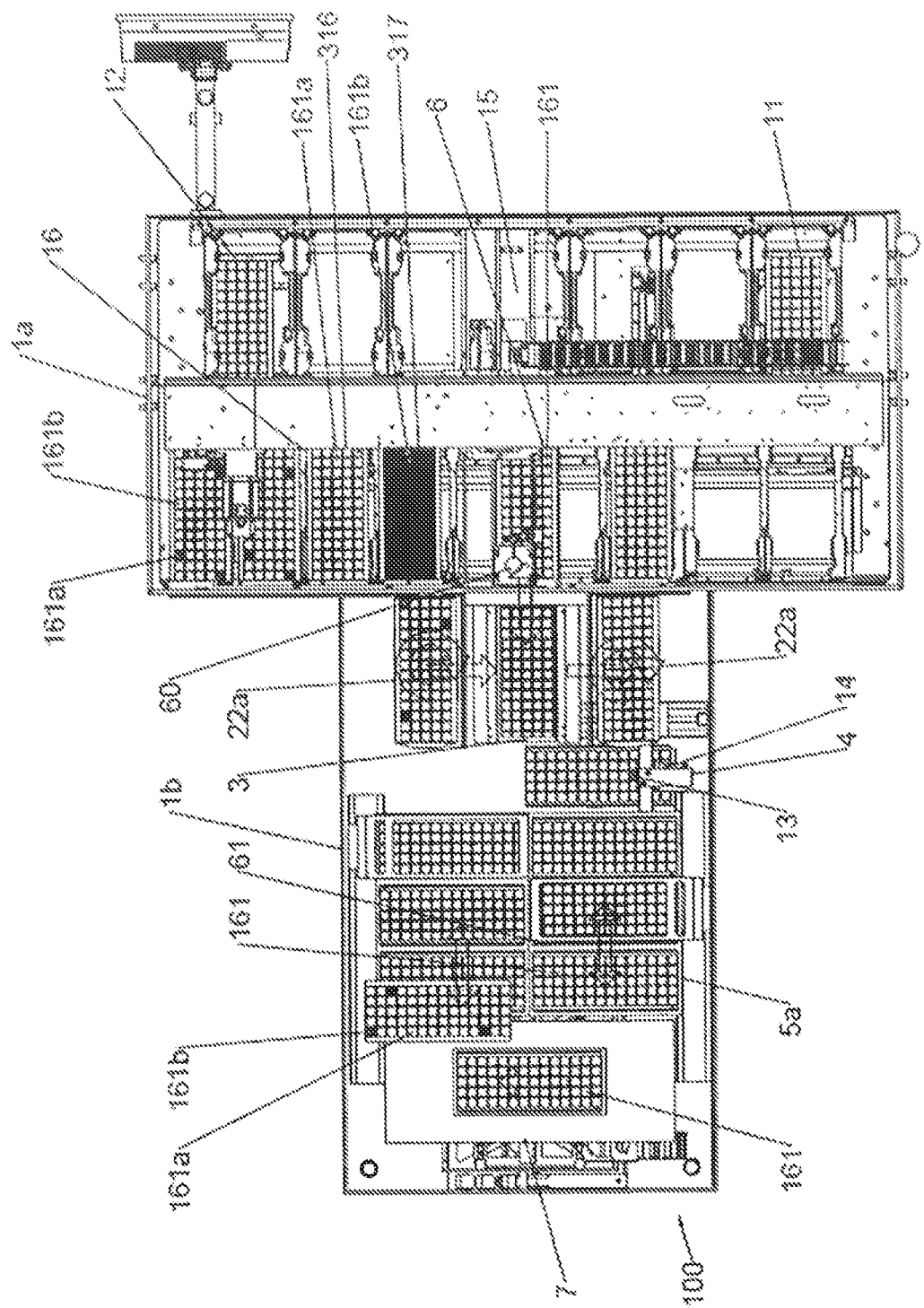
FIG. 9 provides a magnified plan view of the assembly shown in FIGS. 5a,b.

The assembly 100 can be used to perform a method according to further embodiment of the present invention. The method comprises all of the steps performed during the use of the assembly 1 as described above with respect to FIG. 8. The steps which make the method according to this embodiment different to the earlier described method will be described with reference to FIG. 9 which shows a magnified plan view of assembly 100:

Both the first and second soak stations 551a,551b are fully populated (i.e. three boats are positioned at respective zones in the first station 5a and three boats are position at the respective zones in the second station 5b) so that the first and second soak stations 551a,551b are full to capacity. In this example the first soak station 551a is populated with boats 61 having supported on their surfaces 63 devices which are to be tested, and only after the first soak station 551a has been fully populated then the second soak station 551b is populated with boats 61 having supported on their surfaces 63 devices 161 which are to be tested.

After both the first and second soak station 551a,551b have been fully populated then the boat 61 which has been longest in the soak station 551a,551b (which at this point is the boat 61 which a was first moved into the first soak station 5a) is removed from the first soak station 551a; the removed boat 61 is moved to the test station 7 to leave a vacant zone in the first soak station 5a; more specifically the removed boat 61 is moved onto the plunger head 71 of the plunger 17 to leave a vacant zone in the first soak station 5a; the plunger is operated to move the boat 61 into the x, y, z, Theta plunger unit 107 where the devices 161 on the surface 63 of the boat 61 are tested. Simultaneously, as the devices 161 are being tested at the x, y, z, Theta plunger unit 107 the vacant zone in the first soak station 551a is filled with a replacement boat 61 having supported on its surfaces 63 devices 161 which are to be tested. These steps are repeated until all of the boats 61 that were initially provided in the first soak station 551a have been moved to the test station 7 and their respective vacant zones in the first soak station 551a have been refilled with respective replacement boats 61 having devices 161 to be tested.

In the present embodiment after the devices 161 on a boat 61 have been tested at the testing station 7, that boat 61 is then moved to the flipping station 3. Importantly in this embodiment a boat 61 on which there is supported devices 161 which have been tested, is moved from the test station 7, over the second soak station 551b, to the flipping station 3, simultaneously to, performing said the step of removing a boat 61 on which there is supported devices 161 which are to be tested from the first soak station 551a (to bring it to the test station 7), and/or, simultaneously to bringing/moving the removed boat 61 (i.e. a boat which was removed from the first soak station 551a) on which there is supported devices 161 which are to be tested, to the test station 7.

Only after all of the boats 61 that were initially provided in the first soak station 551a have been moved to the test station 7 and their respective vacant zone in the first soak station 551a have been refilled with respective replacement boats 61 having devices 161 to be tested, is a boat 61 removed from the second soak station 551b to leave a vacant zone in the second soak station 551b. The removed boat 61 is moved to the testing station 7; at the testing station the removed boat 61 is moved onto the plunger head 71 of the plunger 17 of the test station 7; and the plunger 17 is operated to move the devices 161 on the boat 61 into the x, y, z, Theta plunger unit 107 where the devices 161 are tested. Simultaneously, as the devices 161 are being tested at the x, y, z, Theta plunger unit 107, the vacant zone in the second soak station 551b is filled with another replacement boat 61 having devices 161 which are to be tested. These steps are repeated until all of the boats 61 that were initially provided in the second soak station 551b have been moved to the test station 7 and their respective vacant zones in the second soak station 551b have been refilled with respective replacement boats 61 having devices 161 to be tested.

In the present embodiment after the devices 161 on a boat 61 have been tested at the testing station 7, that boat 61 is then moved to the flipping station 3. Importantly a boat 61 on which there is supported devices 161 which have been tested, is moved from the test station 7, over the first soak station 551a, to the flipping station 3, simultaneously to, performing said the step of removing a boat 61 on which there is supported devices 161 which are to be tested from the second soak station 551b (to bring it to the test station 7), and/or, simultaneously to bringing/moving the removed boat 61 (i.e. a boat which was removed from the second soak station 551b) on which there is supported devices 161 which are to be tested, to the test station 7.

After all of the boats 61 that were initially provided in the second soak station 551b have been moved to the test station 7 and their respective vacant zones in the second soak station 551b have been refilled with respective replacement boats 61 having devices 161 to be tested, then boats 61 located in the first soak station 551a may again be removed from the first soak station 551a to bring them to the testing station 7—these steps may be repeated a plurality of times—removing boats 61 from the first soak station 551a and moving them to the test station 7 and then removing boats 61 from the second soak station 551b and bringing them to the test station 7.

It is important to note that it is always the boat 61 which has been longest in the soak station 551a,551b which is removed from the test station 551a,551b and moved onto the test station 7 (i.e. moved to the plunger head 71 of the plunger 17 of the test station 7); in other words the boats 61 are removed from the respective first and second soak stations 551a,551b and brought to the test station 7 in the order in which they were loaded into the soak stations 551a,551b.

Importantly in this method embodiment a boat 61 on which there is supported devices 161 which have been tested, is moved from the test station to the flipping station 3, over the other of soak station 551a,551b from which boats 61 are being removed and/or being moved to the testing station 7. In other words if a boat 61 is being removed from the from the first soak station 551a and/or is being moved from the first soak station 551a to the test station 7, then the boat 61 at the testing station 7 whose devices 161 have undergone testing is moved from the testing station 7, over the second soak station 551b, to the flipping station 3; if on the other hand a boat 61 is being removed from the second soak station 551b and/or is being moved from the second soak station 551b to the test station 7, then the boat 61 at the testing station 7 whose devices 161 have undergone testing is moved from the testing station 7, over the first soak station 551a, to the flipping station 3.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A method of handling devices comprising the steps of:
   receiving a tray on which devices to be tested are supported, into a flipping station;
   positioning the tray under a boat, so that the devices which are supported on the tray are sandwiched between the tray and a surface of the boat which can support devices, to form a first stack;
   flipping the first stack, so that the tray is positioned over the boat, to cause the devices to fall, under the influence of gravity, away from the tray to become supported on the surface of the boat, thereby transferring the devices from the tray to the surface of the boat;
   moving the boat to a testing station and testing the devices on the boat (61);
   receiving the boat of tested devices into the flipping station;
   positioning a tray over the boat, so that the devices which are supported on the surface of the boat are sandwiched between the surface of the boat and tray to form a second stack;
   flipping the second stack so that the boat is positioned over the tray, to cause the devices to fall, under the influence of gravity, away from the surface of the boat to become supported on the tray, thereby transferring the devices from the surface of the boat to the tray; characterized in that the method further comprises the steps of interposing a grid, which comprises a plurality of cut-outs defined therein, between the surface of the boat and tray on which the devices are supported, so that the first stack further comprises the grid;
   arranging the grid so that, after the first stack has been flipped, the devices which are supported on the surface of the boat project into a respective cut-out in the grid;
   after the first stack has been flipped, vibrating the grid and the boat so that each of the devices abuts an edge defining a respective cut-out, so as to move the devices into predefined respective positions on the surface of the boat.

2. A method according to claim 1 wherein the method comprises applying a vacuum to hold the devices, which sucks the devices towards the boat, immediately after the step of vibrating is completed so that the devices are held in their respective predefined positions on the surface of the boat.

3. A method according to claim 1 wherein the method comprises, interposing a grid, which comprises a plurality of cut-outs defined therein, between the tray and the surface of the boat on which the devices are supported, so that the second stack further comprises the grid;
  arranging the grid so that, after the second stack has been flipped, the devices which are supported on the tray project into a respective cut-out in the grid;
  after the second stack has been flipped, vibrating the grid and the tray so that each of the devices abuts an edge defining a respective cut-out, so as to move the devices into predefined respective positions on the tray.

4. A method according to claim 1, comprising,
scanning the devices which are supported on the surface of the boat using a camera;
detecting using image information provided by the camera if any of the devices on the surface of the boat are displaced from a respective predefined position;
picking any devices which are identified as being displaced from their respective predefined position using a pickup head;
placing the picked devices on the boat in a position corresponding to said device's respective predefined position.

5. A method according to claim 1, comprising,
using a pickup head to adjust the positions of one or more devices on the boat so that the devices form a predefined pattern on the surface of the boat.

6. A method according to claim 1, comprising,
moving the boat into a soak station; and
heating the devices on the boat to a predefined temperature at the soak station; and then
moving the boat from the soak station to the testing station where the devices on the boat are tested.

7. A method according to claim 1, comprising, after flipping the second stack to transfer the devices from the surface of the boat to the tray,
  (i) picking a device from the tray which failed testing at the testing station to provide a vacant pocket in the tray,
  (ii) picking a replacement device from a source-tray, wherein the source-tray has supported thereon only devices which have passed testing at the testing station, and positioning the replacement device into the vacant pocket of the tray;
  (iii) repeating said steps (i) and (ii) until all the devices which failed testing at the testing station have been replaced with a respective replacement device from the source-tray.

8. A method according to claim 7, comprising, when all the replacement devices have been picked from the source-tray so that the source-tray is empty,
replacing the empty source-tray with the last tray to have been exported from the flipping station and which all of the devices supported thereon had passed testing at the testing station.

9. A method according to claim 7, comprising,
disposing of the picked devices which failed testing at the testing station in a tray designated to hold devices which failed testing.

10. A method according to claim 1, comprising,
scanning the devices on the tray as the tray is being received into the flipping station using a camera, so that the step of scanning is performed simultaneously to said step of receiving a tray on which devices to be tested are supported, into a flipping station;
using image data provided by the camera as the tray is being received into the flipping station, to determine one or more of, the number of devices on the tray, the type of devices on the tray, if any of the devices on the tray are displaced from a predefined position, a code provided on each device; and
after the step of flipping the second stack has been performed, then, exporting the tray from the flipping station, and scanning the devices on the tray as the tray is being exported from the flipping station using the camera, so that the step of scanning is performed simultaneously to said step of exporting the tray;
using image data provided by the camera as the tray is being exported from the flipping station, to determine one or more of, the number of devices on the tray, the type of devices on the tray, if any of the devices on the tray are displaced from a predefined position, a code provided on each device.

11. A method according to claim 1, comprising,
  (a) providing a first and second soak stations each of which is configured to receive one or more boats on which devices to be tested are supported; and wherein the first and second soak stations each comprise heating means which can heat boats and devices which are located in that respective temperature station;
  (b) populating both the first and second soak stations with one or more boats on which devices to be tested are supported, until the first and second soak stations are fully populated with boat on which devices to be tested are supported;
  (c) removing a boat from the first soak station to leave a vacant position in the first soak station, and, moving the removed boat to the testing station; and refilling the vacant position in the first soak station with a replacement boat on which devices to be tested are supported, as the removed boat is being tested at the testing station;
  (d) repeat step (c) until all of the boats that were initially provided in the first soak station at step (b) have been moved to the testing station and their respective vacant positions in the first soak station have been refilled with respective replacement boats having devices to be tested;
  (e) after step (d) is completed then, removing a boat from the second soak station to leave a vacant position in the second soak station, and, moving the removed boat to the testing station; and refilling the vacant position in the second soak station with a replacement boat on which devices to be tested are supported, as the removed boat is being tested at the testing station;
  (f) repeat step (e) until all of the boats that were initially provided in the second soak station at step (b) have been moved to the testing station and their respective vacant positions in the second soak station have been refilled with respective replacement boats having devices to be tested.

12. A method according to claim 11 further comprising the steps of repeating steps (c)-(f) a plurality of times.

13. A method according to claim 11, comprising the steps of,
moving a boat on which there is supported devices which have been tested, from the testing station, over the second soak station, to the flipping station, simultaneously to performing said step of moving a removed boat, which was removed from the first soak station, to the testing station; and
moving a boat on which there is supported devices which have been tested, from the testing station, over the first soak station, to the flipping station, simultaneously to performing the step of moving a removed boat which was removed from the second soak station to the testing station.

14. An assembly for handling devices, the assembly comprising one or more trays, one or more boats, a flipping station, a testing station, and characterized in that the assembly further comprises a data processing means programmed to implement a method according to claim 1.

* * * * *